(12) United States Patent
Liu et al.

(10) Patent No.: US 11,373,585 B2
(45) Date of Patent: Jun. 28, 2022

(54) DRIVING BACKPLANE, DISPLAY PANEL AND METHOD FOR MANUFACTURING THE SAME

(71) Applicant: BOE TECHNOLOGY GROUP CO., LTD., Beijing (CN)

(72) Inventors: Wenqu Liu, Beijing (CN); Qi Yao, Beijing (CN); Feng Zhang, Beijing (CN); Zhijun Lv, Beijing (CN); Liwen Dong, Beijing (CN); Zhao Cui, Beijing (CN); Xiaoxin Song, Beijing (CN); Detian Meng, Beijing (CN); Libo Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 97 days.

(21) Appl. No.: 17/070,338

(22) Filed: Oct. 14, 2020

(65) Prior Publication Data

US 2021/0110761 A1    Apr. 15, 2021

(30) Foreign Application Priority Data

Oct. 15, 2019 (CN) .......................... 201910979586.3

(51) Int. Cl.
*G09G 3/32* (2016.01)
*H01L 27/15* (2006.01)
*H01L 33/38* (2010.01)
*H01L 33/62* (2010.01)

(52) U.S. Cl.
CPC ............. *G09G 3/32* (2013.01); *H01L 27/156* (2013.01); *H01L 33/387* (2013.01); *H01L 33/62* (2013.01)

(58) Field of Classification Search
CPC ..... H01L 33/62; H01L 25/167; H01L 27/156; H01L 33/387; H01L 24/95; H01L 2933/0066; H01L 25/0753; G09G 3/32; G09G 3/3233; G09G 2300/0426
See application file for complete search history.

(56) References Cited

U.S. PATENT DOCUMENTS

| 10,062,335 B1* | 8/2018 | Chung | H03K 17/9643 |
| 2019/0187748 A1* | 6/2019 | Lim | G06F 1/1605 |
| 2020/0403045 A1* | 12/2020 | Yeon | G09G 3/32 |
| 2020/0410194 A1* | 12/2020 | Kim | H01L 41/0471 |
| 2021/0217810 A1* | 7/2021 | Guo | H01L 27/1214 |

FOREIGN PATENT DOCUMENTS

CN        112347880 A    *  2/2021

* cited by examiner

*Primary Examiner* — Vinh T Lam
(74) *Attorney, Agent, or Firm* — Procopio, Cory, Hargreaves & Savitch LLP

(57) ABSTRACT

A driving backplane includes a base, and a pixel driving circuit, a first electrode and a first piezoelectric block that are disposed in the sub-pixel region. The pixel driving circuit is disposed on the base. The first electrode is disposed at a side of the pixel driving circuit away from the base. The first electrode includes a first sub-electrode pattern and a second sub-electrode pattern that are in a same layer and are spaced apart to be insulated from each other, and the first sub-electrode pattern is electrically connected to the pixel driving circuit. The first piezoelectric block is disposed between the pixel driving circuit and the first electrode, and the first sub-electrode pattern and the second sub-electrode pattern are in contact with the first piezoelectric block.

20 Claims, 13 Drawing Sheets

US 11,373,585 B2

DRIVING BACKPLANE, DISPLAY PANEL AND METHOD FOR MANUFACTURING THE SAME

CROSS-REFERENCE TO RELATED APPLICATION

This application claims priority to Chinese Patent Application No. 201910979586.3, filed on Oct. 15, 2019, which is incorporated herein by reference in its entirety.

TECHNICAL FIELD

The present disclosure relates to the field of display technologies, and in particular, to a driving backplane, a display panel and a method for manufacturing the same.

BACKGROUND

Micro light-emitting diode display apparatuses have become one of the hot topics in the development of display technologies due to their advantages of self-luminescence, high brightness, low power consumption, ultra-high resolution and high chroma.

SUMMARY

In one aspect, a driving backplane is provided, and the driving backplane has a sub-pixel region. The driving backplane includes a base, and a pixel driving circuit, a first electrode and a first piezoelectric block that are disposed in the sub-pixel region. The pixel driving circuit is disposed on the base. The first electrode is disposed at a side of the pixel driving circuit away from the base. The first electrode includes a first sub-electrode pattern and a second sub-electrode pattern that are in a same layer and are spaced apart to be insulated from each other, and the first sub-electrode pattern is electrically connected to the pixel driving circuit. The first piezoelectric block is disposed between the pixel driving circuit and the first electrode, and the first sub-electrode pattern and the second sub-electrode pattern are in contact with the first piezoelectric block.

In some embodiments, the first sub-electrode pattern is disposed around the second sub-electrode pattern in a non-closed manner.

In some embodiments, a shape of the first sub-electrode pattern is a non-closed ring, and the second sub-electrode pattern is disposed within the first sub-electrode pattern.

In some embodiments, a shape of the first sub-electrode pattern is a U-shape, a shape of the second sub-electrode pattern is a bar-shape, and the second sub-electrode pattern is disposed between two opposite sides of the first sub-electrode pattern.

In some embodiments, the driving backplane further includes a second electrode and a second piezoelectric block that are disposed in the sub-pixel region. The second electrode includes a third sub-electrode pattern and a fourth sub-electrode pattern that are in a same layer and are spaced apart to be insulated from each other. The third sub-electrode pattern is electrically connected to a first signal line, and the second electrode and the first electrode are disposed in a same layer and insulated from each other. The second piezoelectric block is disposed in a same layer as the first piezoelectric block, and the third sub-electrode pattern and the fourth sub-electrode pattern are in contact with the second piezoelectric block.

In some embodiments, the third sub-electrode pattern is disposed around the fourth sub-electrode pattern in a non-closed manner.

In some embodiments, a shape of the third sub-electrode pattern is a non-closed ring, and the fourth sub-electrode pattern is disposed within the third sub-electrode pattern.

In some embodiments, a shape of the third sub-electrode pattern is a U shape, a shape of the fourth sub-electrode pattern is a bar shape, and the fourth sub-electrode pattern is disposed between two opposite sides of the third sub-electrode pattern.

In another aspect, a display panel is provided. The display panel includes the driving backplane as described above, a micro light-emitting diode and a first connecting electrode. The micro light-emitting diode is disposed in the sub-pixel region and on a side of the first electrode of the driving backplane away from the base. The first connecting electrode electrically connects one of an anode and a cathode of the micro light-emitting diode to the first sub-electrode pattern of the first electrode.

In some embodiments, the first connecting electrode is disposed on a surface of the first sub-electrode pattern away from the base.

In some embodiments, the first connecting electrode is made of gold-nickel alloy.

In some embodiments, the first connecting electrode is disposed on at least one side face of the first sub-electrode pattern.

In some embodiments, the first sub-electrode pattern is disposed around the second sub-electrode pattern in a non-closed manner. The first connecting electrode is disposed on a side face of the first sub-electrode pattern away from the second sub-electrode pattern, or, the first connecting electrode is disposed between the first sub-electrode pattern and the second sub-electrode pattern.

In some embodiments, the first connecting electrode is made of solder paste.

In some embodiments, the driving backplane further includes a second electrode and a second piezoelectric block that are disposed in the sub-pixel region. The second electrode includes a third sub-electrode pattern and a fourth sub-electrode pattern that are in a same layer and are spaced apart to be insulated from each other, and the third sub-electrode pattern is electrically connected to a first signal line. The second electrode and the first electrode are disposed in a same layer and insulated from each other. The second piezoelectric block is disposed in a same layer as the first piezoelectric block, and the third sub-electrode pattern and the fourth sub-electrode pattern are in contact with the second piezoelectric block. The display panel further includes a second connecting electrode disposed in the sub-pixel region, and another of the anode and the cathode of the micro light-emitting diode and the third sub-electrode pattern are electrically connected through the second connecting electrode.

In some embodiments, the micro light-emitting diode further includes a light-emitting functional layer that is in contact with and located at a same side of the anode and the cathode away from the first connecting electrode.

In some embodiments, the second connecting electrode is disposed on a surface of the third sub-electrode pattern away from the base.

In some embodiments, the third sub-electrode pattern is disposed around the fourth sub-electrode pattern in a non-closed manner. The second connecting electrode is disposed on at least one side face of the third sub-electrode pattern away from the fourth sub-electrode pattern, or, the second connecting electrode is disposed between the third sub-electrode pattern and the fourth sub-electrode pattern.

In yet another aspect, a method of manufacturing a display panel is provided. The method includes: aligning the micro light-emitting diode with the first electrode of the driving backplane; applying pressure to the first piezoelectric block in contact with the first sub-electrode pattern and the second sub-electrode pattern, to adsorb the micro light-emitting diode; and forming the first connecting electrode, to make the one of the anode and the cathode of the micro light-emitting diode and the first sub-electrode pattern of the first electrode be electrically connected through the first connecting electrode.

In some embodiments, the driving backplane further includes a second electrode and a second piezoelectric block that are disposed in the sub-pixel region. The second electrode includes a third sub-electrode pattern and a fourth sub-electrode pattern that are in a same layer and are spaced apart to be insulated from each other, and the third sub-electrode pattern of the second electrode is electrically connected to a first signal line. The second electrode and the first electrode disposed in a same sub-pixel region are disposed in a same layer and insulated from each other. The second piezoelectric block is disposed in a same layer as the first piezoelectric block, and the third sub-electrode pattern and the fourth sub-electrode pattern of the second electrode are in contact with the second piezoelectric block. The method further includes: aligning the micro light-emitting diode with the second electrode of the driving backplane while aligning the micro light-emitting diode with the first electrode of the driving backplane; applying pressure to the second piezoelectric block in contact with the third sub-electrode pattern and the fourth sub-electrode pattern of the second electrode while applying pressure to the first piezoelectric block in contact with the first sub-electrode pattern and the second sub-electrode pattern of the first electrode, to adsorb the micro light-emitting diode; and forming the second connecting electrode while forming the first connecting electrode, to make another of the anode and the cathode of the micro light-emitting diode and the third sub-electrode pattern of the second electrode be electrically connected through the second connecting electrode.

BRIEF DESCRIPTION OF THE DRAWINGS

In order to describe technical solutions in the present disclosure more clearly, accompanying drawings to be used in some embodiments of the present disclosure will be introduced below briefly. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1:
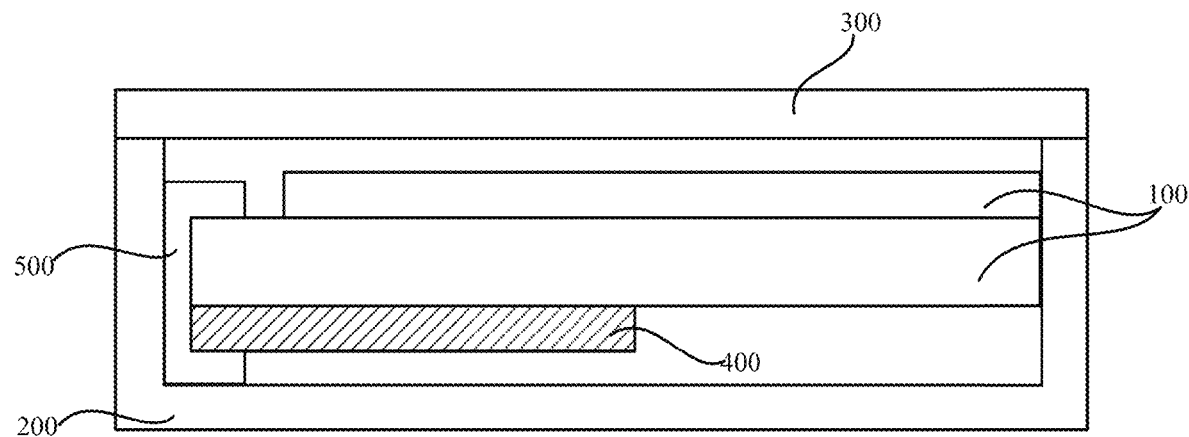
FIG. 1 is a schematic diagram of a display apparatus, in accordance with some embodiments.

Technical solutions in some embodiments of the present disclosure will be described below clearly and completely with reference to the accompanying drawings. However, the described embodiments are merely some but not all embodiments of the present disclosure. All other embodiments obtained on a basis of the embodiments of the present disclosure by a person of ordinary skill in the art will be included in the protection scope of the present disclosure.

As used herein, the singular form "a" and "an" are intended to include the plural forms as well, unless the context clearly indicates otherwise. Unless the context requires otherwise, the term "comprise" and other forms thereof, such as the third-person singular form "comprises"

and the present participle form "comprising", in the description and the claims are construed as open and inclusive. i.e., "inclusive, but not limited to". In the description, terms such as "one embodiment", "some embodiments", "exemplary embodiments", "example", "specific example", or "some examples" are intended to indicate that specific features, structures, materials or characteristics related to the embodiment(s) or the example(s) are included in at least one embodiment or example of the present disclosure. Schematic representations of the above terms do not necessarily refer to the same embodiment(s) or example(s). In addition, the specific features, structures, materials or characteristics may be included in any one or more embodiments/examples in any suitable manner.

Hereinafter, the terms such as "first" and "second" are only used for descriptive purposes, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the terms "a plurality of" and "the plurality of" mean two or more unless otherwise specified.

The term "same layer" refers to that a film for forming specific patterns is formed by the same film forming process and then is patterned by a patterning process using the same mask to form a layer structure. The patterning process may include exposure, development and etching processes. The specific patterns in the formed layer structure may be continuous or discontinuous, and the specific patterns may be at different heights or have different thicknesses.

In the description of some embodiments, the term such as "connected" and its extensions may be used. For example, the term "connected" may be used in the description of some embodiments to indicate that two or more components are in direct physical or electrical contact with each other. However, the term such as "connected" may also mean that two or more components are not in direct contact with each other but still cooperate or interact with each other. The embodiments disclosed herein are not necessarily limited to the contents herein.

It will be understood that when a layer or element is referred to as being "on" another layer or substrate, it can be directly on the other layer or substrate, or intervening layers may also be present.

Exemplary embodiments are described herein with reference to sectional views and/or plan views as idealized exemplary drawings. In the accompanying drawings, thicknesses of layers and regions are magnified for clarity. Exemplary embodiments of the present disclosure will not be construed as limitation to shapes of regions shown herein, but to include deviations in shape due to, for example, manufacturing. For example, an etched region shown in a rectangular shape generally has a curved feature. Therefore, regions shown in the accompanying drawings are schematic in nature and their shapes are not intended to show actual shapes of the regions of a device, which is not intended to limit the scope of the exemplary embodiments.

Some embodiments of the present disclosure provide a display apparatus. The display apparatus may be any product or component having a display function, such as a mobile phone, a tablet computer, a personal digital assistant (PDA), a digital photo frame, a navigator, or an on-board computer.

In some embodiments, as shown in FIG. 1, the display apparatus includes a display panel 100, a frame 200, a cover plate 300, a circuit board 400, a flexible printed circuit (FPC) 500, etc. Of course, the display apparatus may include more or fewer components, and the relative positions among the components may be changed.

For example, a cross-section of the frame 200 has a U-shape, and the display panel 100, the circuit board 400 and the FPC 500 are disposed in a cavity enclosed by the frame 200 and the cover plate 300. One end of the FPC 500 is bonded to an edge of the display panel 100, and the other end of the FPC 500 is bonded to the circuit board 400. The circuit board 400 is disposed on a side of the display panel 100 away from the cover plate 300.

In some examples, the FPC 500 includes a flexible circuit board body and at least one driver chip on the flexible circuit board body, and the at least one driver chip may be at least one driver integrated circuit (IC). For example, the at least one driver IC includes at least one data driver IC.

In some examples, the circuit board 400 is configured to provide the display panel 100 with signals required for display. For example, the circuit board 400 is a printed circuit board assembly (PCBA). The PCBA includes a printed circuit board (PCB), and a timing controller (TCON), a power management IC (PMIC), and other ICs or circuits that are disposed on the PCB.

Figure 2:
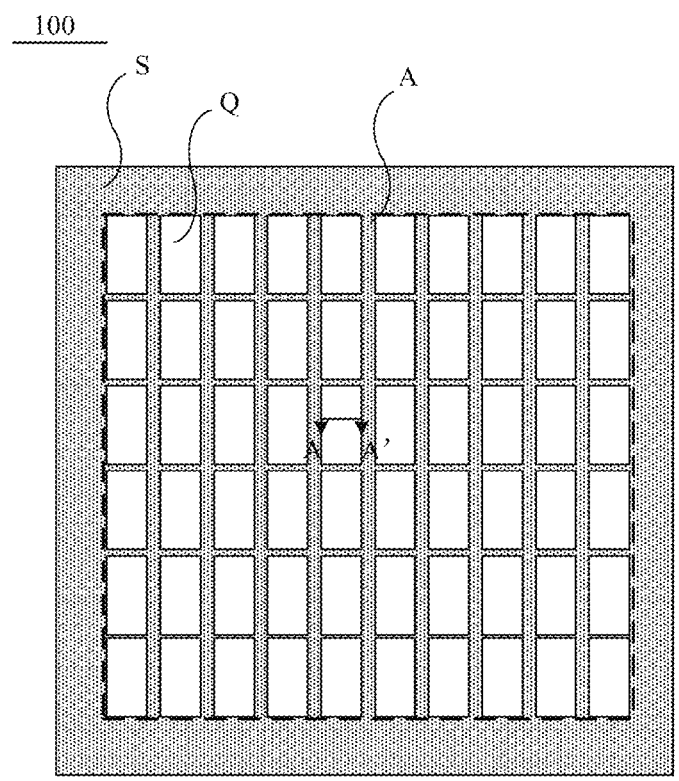
FIG. 2 is a top view of a display panel, in accordance with some embodiments.

As shown in FIG. 2, the display panel 100 has a display area A and a peripheral region S. In some examples, the peripheral region S is located around the display area A. In some other examples, the peripheral region S is only located on a side of the display area A. In some other examples, the peripheral region S is located on opposite sides of the display area A. The peripheral region S is used for wiring, and of course, a driver circuit (e.g., a gate driver circuit) may be provided in the peripheral region S. The display area A includes a plurality of sub-pixel regions Q. FIG. 2 illustrates an example in which the peripheral region S is disposed around the display area A, and the plurality of sub-pixel regions Q are arranged in a matrix form.

Figure 3:
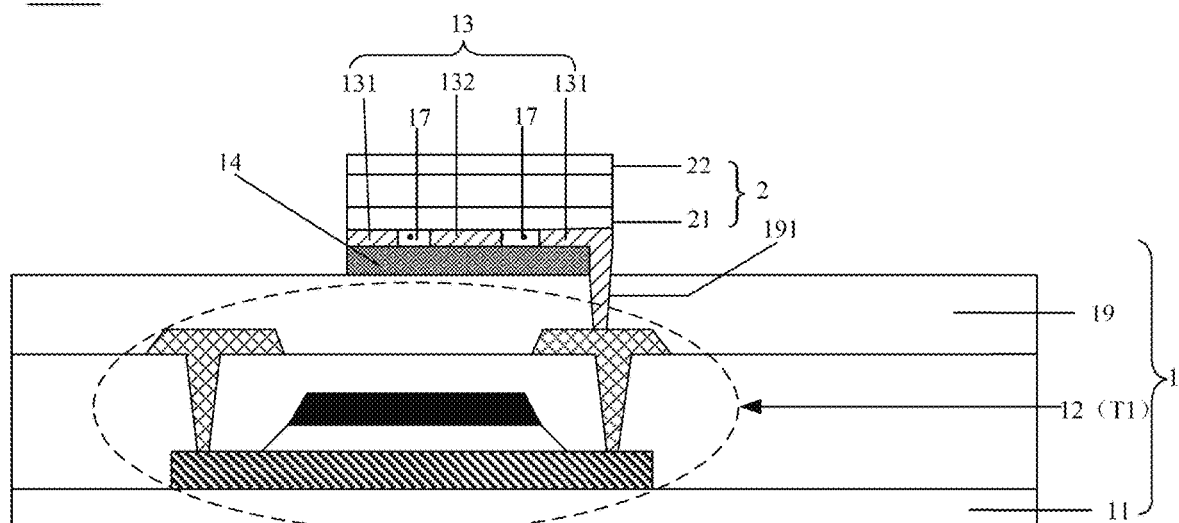
FIG. 3 is a cross-sectional view of the display panel along the A-A' line in FIG. 2, in accordance with some embodiments.
Figure 4:
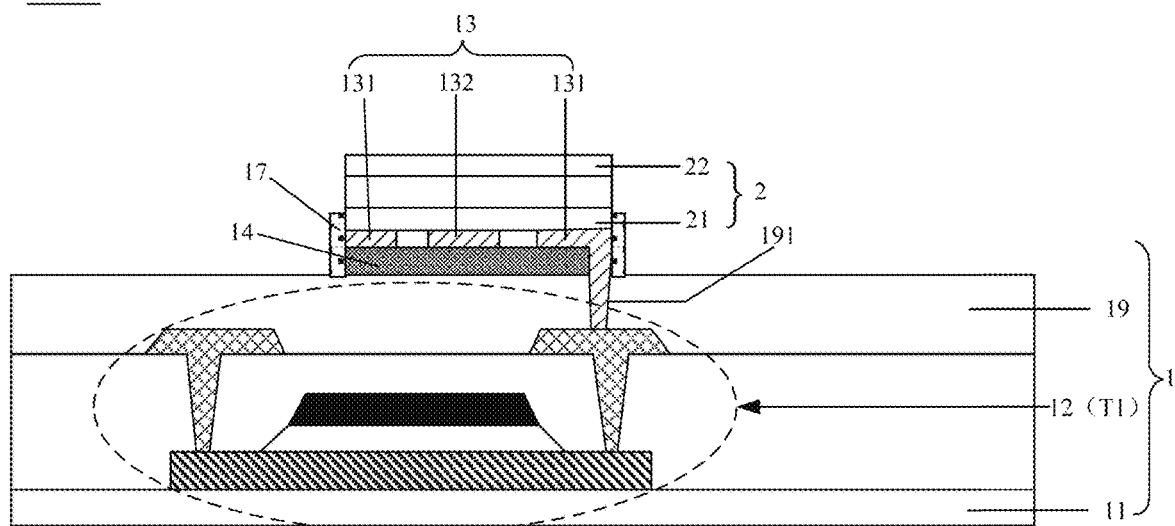
FIG. 4 is another cross-sectional view of the display panel along the A-A' line in FIG. 2, in accordance with some embodiments.
Figure 5:
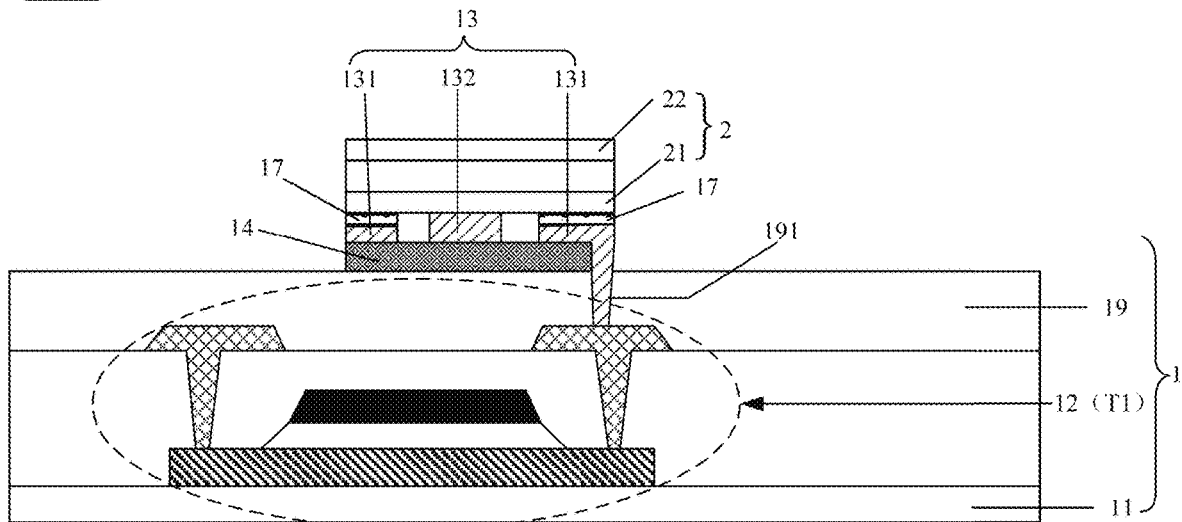
FIG. 5 is yet another cross-sectional view of the display panel along the A-A' line in FIG. 2, in accordance with some embodiments.

In some embodiments, as shown in FIGS. 3 to 5, the display panel 100 includes a driving backplane 1 and a plurality of micro light-emitting diodes 2 disposed on the driving backplane 1. Each micro light-emitting diode 2 is disposed in a corresponding sub-pixel region Q.

In some embodiments, the plurality of micro light-emitting diodes 2 includes a plurality of first micro light-emitting diodes, a plurality of second micro light-emitting diodes and a plurality of third micro light-emitting diodes. For example, the first micro light-emitting diode is configured to emit red light, the second micro light-emitting diode is configured to emit green light, and the third micro light-emitting diode is configured to emit blue light.

In some examples, the micro light-emitting diode 2 is a mini light-emitting diode (Mini LED). In some other examples, the micro light-emitting diode 2 is a Micro LED.

Figure 6:
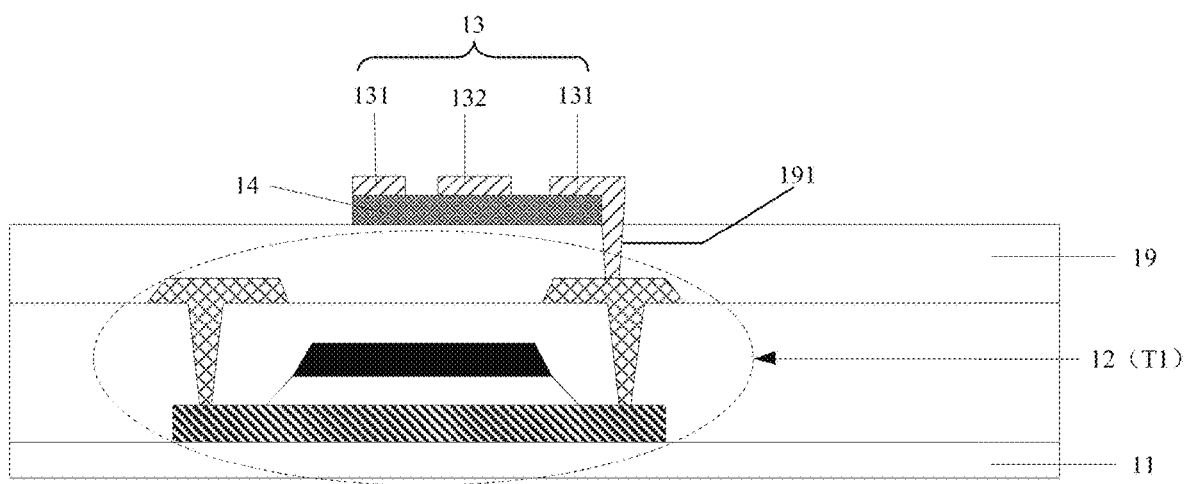
FIG. 6 is a cross-sectional view of a driving backplane, in accordance with some embodiments.

In some embodiments, as shown in FIG. 6, the driving backplane 1 includes a base 11, and a plurality of pixel driving circuits 12, a plurality of first electrodes 13 and a plurality of first piezoelectric blocks 14 that are disposed on the base 11. The plurality of first electrodes 13 are disposed at a side of the plurality of pixel driving circuits 12 away from the base 11. The plurality of first piezoelectric blocks 14 are disposed between the plurality of first electrodes 13 and the plurality of pixel driving circuits 12. Generally, the plurality of first piezoelectric blocks 14 are not in contact with the plurality of pixel driving circuits 12. For example, each first electrode 13 corresponds to a pixel driving circuit 12 and a first piezoelectric block 14, and the three are disposed in a same sub-pixel region Q.

It will be noted that FIG. 6 only illustrates the pixel driving circuit 12, the first electrode 13 and the first piezoelectric block 14 located in a sub-pixel region Q to show the structure more clearly. It will be understood that a pixel driving circuit 12, a first electrode 13 and a first piezoelectric block 14 located in another sub-pixel region Q have a same structure as the pixel driving circuit 12, the first electrode 13 and the first piezoelectric block 14 located in the sub-pixel region Q.

In some examples, the base 11 may be a flexible base or a rigid base. The flexible base is made of, for example, polyimide (PI) or Polyethylene terephthalate (PET). The rigid base is made of, for example, glass.

With continued reference to FIGS. 6 and 8 to 10, the first electrode 13 includes a first sub-electrode pattern 131 and a second sub-electrode pattern 132 that are in a same layer and are spaced apart to be insulated from each other. As shown in FIG. 6, the first sub-electrode pattern 131 is electrically connected to a corresponding pixel driving circuit 12, and the first electrode 13 and the corresponding pixel driving circuit 12 are located in a same sub-pixel region Q. Both the first sub-electrode pattern 131 and the second sub-electrode pattern 132 are in contact with a corresponding first piezoelectric block 14, and the first electrode 13 and the corresponding first piezoelectric block 14 are also located in the same sub-pixel region Q.

It will be noted that in some examples, each of some of the plurality of first electrodes 13 includes the first sub-electrode pattern 131 and the second sub-electrode pattern 132 that are in the same layer and are spaced apart to be insulated from each other. In this case, the first sub-electrode pattern 131 is electrically connected to a corresponding pixel driving circuit 12, and both the first sub-electrode pattern 131 and the second sub-electrode pattern 132 are in contact with a corresponding first piezoelectric block 14.

In some other examples, each of the plurality of first electrodes 13 includes the first sub-electrode pattern 131 and the second sub-electrode pattern 132 that are in the same layer and are spaced apart to be insulated from each other. In this case, the first sub-electrode pattern 131 is electrically connected to a corresponding pixel driving circuit 12, and both the first sub-electrode pattern 131 and the second sub-electrode pattern 132 are in contact with a corresponding first piezoelectric block 14.

In some examples, as shown in FIGS. 3 to 6, the driving backplane 1 further includes an insulating layer 19 between the plurality of pixel driving circuits 12 and the plurality of first piezoelectric blocks 14. The insulating layer 19 is disposed on the side of the plurality of pixel driving circuits 12 away from the base 11 as a whole and has a plurality of first via holes 191. The first sub-electrode pattern 131 of the first electrode 13 may be electrically connected to the corresponding pixel driving circuit 12 through a corresponding first via hole 191. For example, the insulating layer 19 may be formed as follows: an insulating film is formed by chemical vapor deposition after the pixel driving circuit 12 is formed, and then the plurality of first via holes 191 can be formed by a patterning process.

In some examples, the first piezoelectric block 14 is made of a piezoelectric material. The piezoelectric material includes an inorganic piezoelectric material such as crystal (quartz crystal), lithium gallate, lithium germanate, or lithium tantalite, or polyvinylidene fluoride (PVDF) or other organic piezoelectric materials typified by the PVDF. The piezoelectric material has a piezoelectric effect, and a mechanism of the piezoelectric effect is as follows: when the piezoelectric material is placed under mechanical stress, a relative displacement of positive ions and negative ions in unit cells of the piezoelectric material makes centers of positive charges and negative charges not coincide anymore, so that the crystal undergoes macroscopic polarization. And a surface charge density on a surface of the crystal is equal to a component of the polarization vector normal to this surface, so that charges of different signs may appear on two end faces of the piezoelectric material respectively when the piezoelectric material deforms under the mechanical stress.

For example, a shape of the first piezoelectric block 14 may be a rectangular shape or other shape, as long as a corresponding relationship of the first piezoelectric block 14, the first electrode 13 and the pixel driving circuit 12 can be ensured.

Figure 7A:
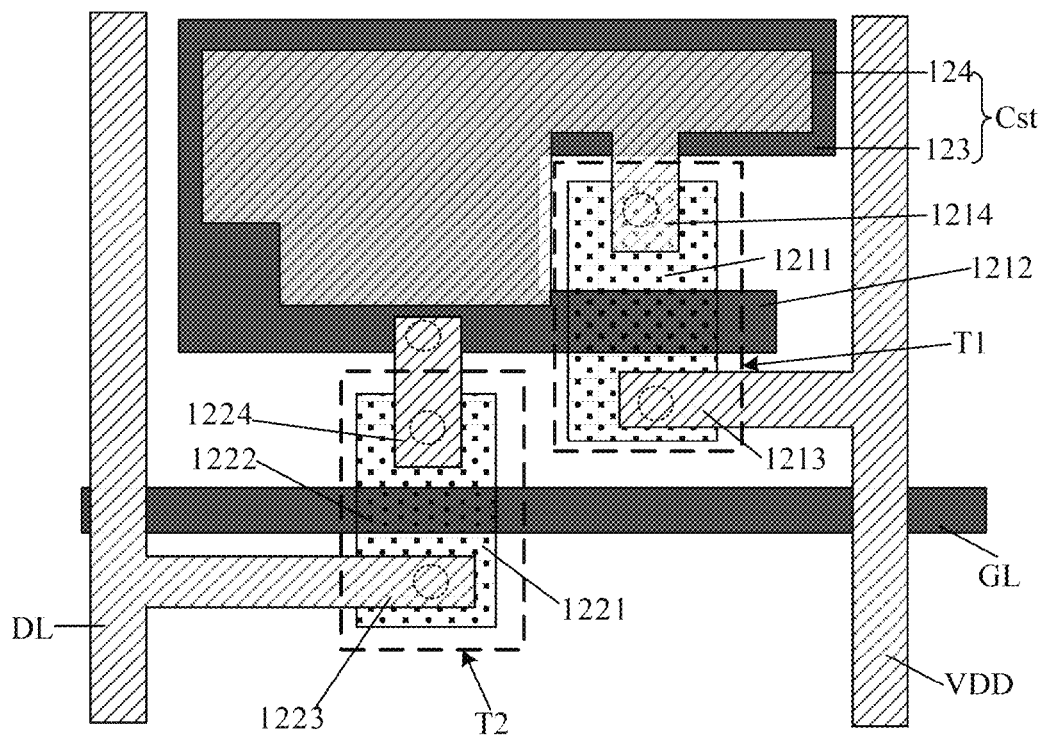
FIG. 7A is a top view of a pixel driving circuit, in accordance with some embodiments.
Figure 7B:
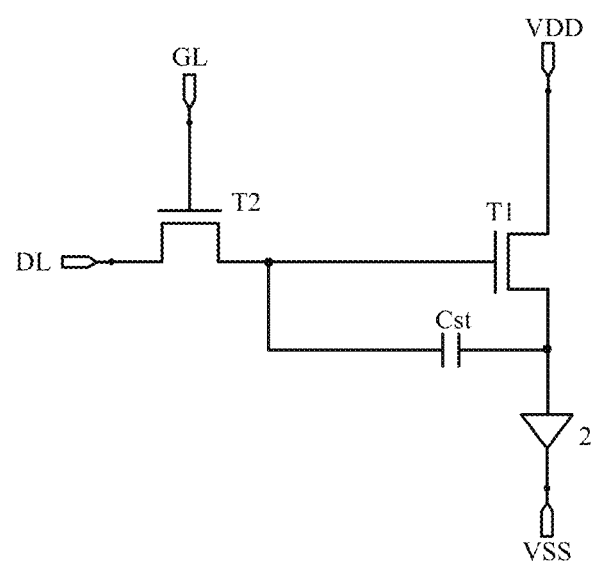
FIG. 7B is an equivalent circuit diagram of the pixel driving circuit in FIG. 7A, in accordance with some embodiments.

In some examples, the pixel driving circuit 12 has a circuit structure of 2T1C, which includes two transistors and one capacitor. As shown in FIGS. 7A and 7B, the pixel driving circuit 12 includes a first transistor T1, a second transistor T2 and a storage capacitor Cst. For example, the first transistor T1 is a driving transistor, and the second transistor T2 is a switching transistor. It will be understood by a person of ordinary skill in the art that in the pixel driving circuit 12, a width-length ratio of a channel of the driving transistor is greater than a width-length ratio of a channel of another transistor acting as a switch.

For example, as shown in FIG. 7A, the first transistor T1 includes a first active pattern 1211, a first gate 1212, a first source 1213 and a first drain 1214. The second transistor T2 includes a second active pattern 1221, a second gate 1222, a second source 1223 and a second drain 1224. The storage capacitor Cst includes a first storage electrode 123 and a second storage electrode 124.

For example, as shown in FIG. 7A, the first storage electrode 123 is disposed in a same layer as the first gate 1212 of the first transistor T1 and the second gate 1222 of the second transistor T2. The first storage electrode 123 and the first gate 1212 are integrally formed, and the first storage electrode 123 and the second gate 1222 are insulated from each other. The second storage electrode 124 is disposed in a same layer as the first source 1213 and the first drain 1214 of the first transistor T1, and the second source 1223 and the second drain 1224 of the second transistor 12. The second storage electrode 124 and one of the first source 1213 and the first drain 1214 are integrally formed, and the other of the first source 1213 and the first drain 1214 is electrically connected to a first power line VDD (FIG. 7A illustrates an example in which the second storage electrode 124 and the first drain 1214 are integrally formed, and the first source 1213 is electrically connected to the first power line VDD). One of the second source 1223 and the second drain 1224 is electrically connected to a data line DL, and the other of the second source 1223 and the second drain 1224 is electrically connected to the first storage electrode 123 (FIG. 7A illustrates an example in which the second source 1223 is electrically connected to the data line DL, and the second drain 1224 is electrically connected to the first storage electrode 123). For example, the first power line VDD and the data line DL are disposed in a same layer as the first source 1213 and the first drain 1214 of the first transistor T1, and the second source 1223 and the second drain 1224 of the second transistor T2.

It will be noted that structures of the first transistor T1 and the second transistor T2 may be top-gate structures or bottom-gate structures.

Figure 7C:
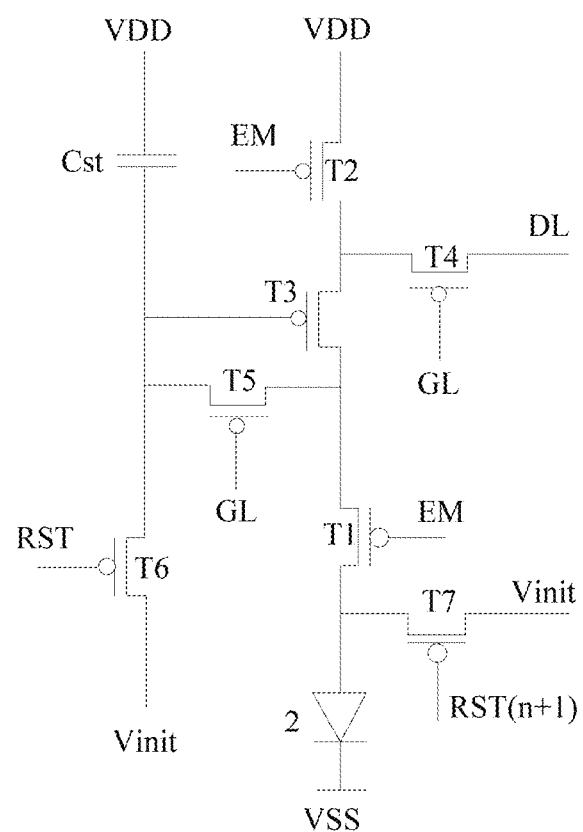
FIG. 7C is an equivalent circuit diagram of another pixel driving circuit, in accordance with some embodiments.

In some other examples, the pixel driving circuit 12 has a circuit structure of 7T1C, which includes seven transistors and one capacitor. As shown in FIG. 7C, the pixel driving circuit 12 includes a first transistor T1, a second transistor T2, a third transistor 13, a fourth transistor T4, a fifth transistor T5, a sixth transistor T6, a seventh transistor T7 and a storage capacitor Cst. The storage capacitor Cst includes a first storage electrode and a second storage electrode. For example, the third transistor T3 is a driving transistor, and other transistors are switching transistors.

As shown in FIG. 7C, a fourth gate of the fourth transistor T4 is electrically connected to a gate line GL, a fourth source of the fourth transistor T4 is electrically connected to the data line DL, and a fourth drain of the fourth transistor T4 is electrically connected to a third source of the third transistor T3. A third drain of the third transistor T3 is electrically connected to a first source of the first transistor T1 and a fifth source of the fifth transistor T5, and a third gate of the third transistor T3 is electrically connected to a fifth drain of the fifth transistor T5. The fifth gate of the fifth transistor T5 is electrically connected to the gate line GL. The first gate of the first transistor T1 is electrically connected to an enable signal line EM, and a first drain of the first transistor T1 is electrically connected to an anode of the micro light-emitting diode. A second gate of the second transistor T2 is electrically connected to the enable signal line EM, a second source of the second transistor T2 is electrically connected to a first power line VDD, and a second drain of the second transistor T2 is electrically connected to a third source of the third transistor T3. A sixth gate of the sixth transistor T6 is electrically connected to a reset signal line RST, a sixth source of the sixth transistor T6 is electrically connected to an initialization signal line Vinit, and a sixth drain of the sixth transistor T6 is electrically connected to the third gate of the third transistor T3. A seventh gate of the seventh transistor T7 is electrically connected to a reset signal line RST(n+1) connected to a sixth transistor T6 in a next row of pixel driving circuit 12, a seventh source of the seventh transistor T7 is electrically connected to the initialization signal line Vinit, and a seventh drain of the seventh transistor T7 is electrically connected to the anode of the micro light-emitting diode. The first storage electrode of the storage capacitor Cst is electrically connected to the first power line VDD, and the second storage electrode of the storage capacitor Cst is electrically connected to the third gate of the third transistor T3. A cathode of the micro light-emitting diode is electrically connected to a second power line VSS. For example, the first power line VDD is configured to provide a high level voltage signal, and the second power line VSS is configured to provide a low level voltage signal.

It will be noted that, the above examples are merely examples of the pixel driving circuit 12, and the circuit structure of the pixel driving circuit 12 is not limited to the two structures described above, and may be other types of pixel driving circuits, which will not be listed herein. However, regardless of the structure of the pixel driving circuit 12, the pixel driving circuit 12 includes at least a driving transistor, a switching transistor acting as a switch, and a storage capacitor Cst. On this basis, the driving backplane 1 further includes a gate line GL, a data line DL, a first power line VDD and a second power line VSS that are connected to the pixel driving circuit 12.

It will be noted that the transistors may be thin film transistors. Since a source and a drain of the thin film transistor are usually symmetrical in structure and composition, there is no difference between the source and the drain. In order to distinguish two electrodes in the thin film transistor except the gate, one electrode is called the source and the other is called the drain. In addition, the connection relationship between both the cathode and anode of the micro light-emitting diode and the pixel driving circuit 12 may be determined according to the actual structure of the pixel driving circuit 12.

In the display panel 100 provided by some embodiments of the present disclosure, the first electrode 13 electrically connected to the pixel driving circuit 12 includes a first sub-electrode pattern 131 and a second sub-electrode pattern 132, and both the first sub-electrode pattern 131 and the second sub-electrode pattern 132 are in contact with the first piezoelectric block 14 located between the first electrode 13 and the pixel driving circuit 12. In this way, when the micro light-emitting diode 2 is transferred onto the driving backplane 1, the first piezoelectric block 14 may be deformed under action of instantaneous pressure applied to the first piezoelectric block 14. The deformation of the first piezoelectric block 14 results in charges of different signs existing on upper and lower surfaces thereof, and the second sub-electrode pattern 132 and the first sub-electrode pattern 131 may carry static electricity due to contact with the first piezoelectric block 14. However, since the first sub-electrode pattern 131 of the first electrode 13 is electrically connected to the pixel driving circuit 12, the static electricity on the first sub-electrode pattern 131 will be directed to the pixel driving circuit 12, and only the static electricity on the second sub-electrode pattern 132 does exist. The micro light-emitting diode 2 is adsorbed to the driving backplane 1 under action of electrostatic adsorption, so that the electrostatic adsorption and transfer of the micro light-emitting diode 2 may be realized without external voltages.

It will be noted that in a process of transferring the micro light-emitting diode 2 to the driving backplane 1, since the first sub-electrode pattern 131 and the second sub-electrode pattern 132 of the first electrode 13 are spaced apart, it is possible to prevent both the first sub-electrode pattern 131 and the second sub-electrode pattern 132 from being electrically connected to the pixel driving circuit 12, so that the charges on the first piezoelectric block 14 may not be conducted away completely. In addition, after the micro light-emitting diode 2 is transferred onto the driving backplane 1, whether the first sub-electrode pattern 131 and the second sub-electrode pattern 132 of the first electrode 13 are electrically connected is not limited.

Figure 8:
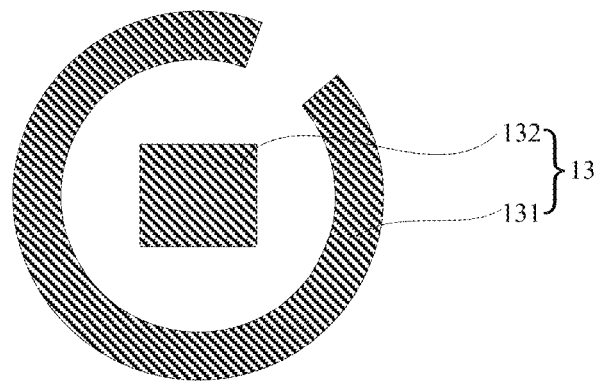
FIG. 8 is a top view of a first electrode, in accordance with some embodiments.
Figure 9:
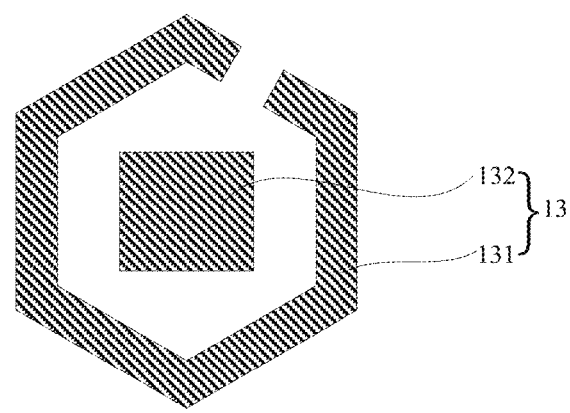
FIG. 9 is a top view of another first electrode, in accordance with some embodiments.
Figure 10:
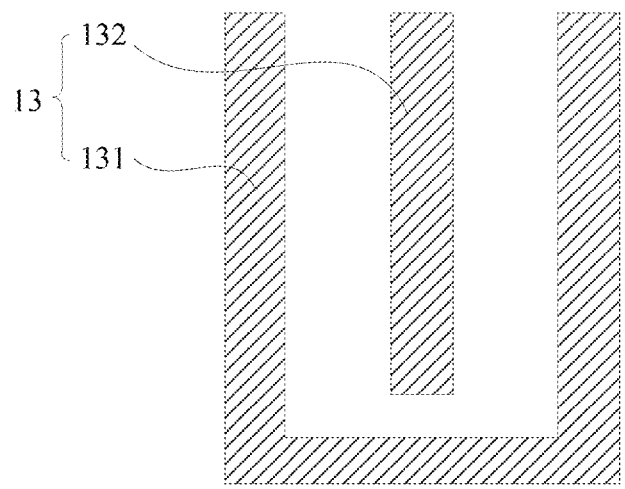
FIG. 10 is a top view of yet another first electrode, in accordance with some embodiments.

In some embodiments, as shown in FIGS. 8 to 10, the first sub-electrode pattern 131 is disposed around the second sub-electrode pattern 132 in a non-closed manner.

In some examples, as shown in FIGS. 8 and 9, a shape of the first sub-electrode pattern 131 is a non-closed ring, and the second sub-electrode pattern 132 is located within the first sub-electrode pattern 131. The non-closed ring means that two ends of the first sub-electrode pattern 131 has an opening. One function of the opening is as follows: after the micro light-emitting diode 2 is transferred onto the driving backplane 1, a conductive material (e.g., the solder paste described below) will be filled between the first sub-electrode pattern 131 and the second sub-electrode pattern 132 through the opening of the first sub-electrode pattern 131, so that the first sub-electrode pattern 131 may be electrically connected to one of anode and cathode of the micro light-emitting diode 2, and thus the one of anode and cathode of the micro light-emitting diode 2 may be electrically connected to the pixel driving circuit 12.

For example, the non-closed ring may be a non-closed circular ring (as shown in FIG. 8) or a non-closed elliptical ring. A shape of the second sub-electrode pattern 132 is a square, and the second sub-electrode pattern 132 is located within the non-closed circular ring or the non-closed elliptical ring.

For another example, as shown in FIG. 9, the shape of the first sub-electrode pattern 131 is a non-closed polygonal ring. For example, as shown in FIG. 9, the shape of the first sub-electrode pattern 131 is a non-closed regular hexagonal ring, and the non-closed regular hexagonal ring has an opening passing through a side of the regular hexagonal ring. A shape of the second sub-electrode pattern 132 is a square, and the second sub-electrode pattern 132 is located within the non-closed regular hexagonal ring.

In some other examples, as shown in FIG. 10, the shape of the first sub-electrode pattern 131 is a U shape, and the shape of the second sub-electrode pattern 132 is a bar shape, That is, the bar-shaped second sub-electrode pattern 132 is located between the two opposite sides of the U-shaped first sub-electrode pattern 131. For example, the bar-shaped second sub-electrode pattern 132 is parallel to the two opposite sides of the U-shaped first sub-electrode pattern 131. For example, the shape of the first sub-electrode pattern 131 is a U shape with 90 degrees of corners. For another example, the shape of the first sub-electrode pattern 131 is a U-shape with arc corners.

Figure 11:
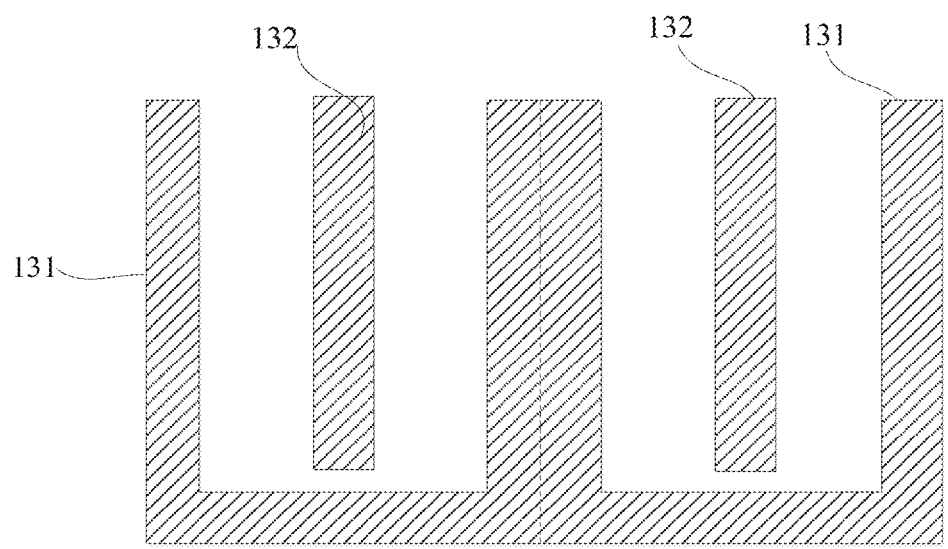
FIG. 11 is a top view of yet another first electrode, in accordance with some embodiments.

In some other embodiments, as shown in FIG. 11, the first electrode 13 includes a plurality of first sub-electrode patterns 131 and a plurality of second sub-electrode patterns 132, and each first sub-electrode pattern 131 is disposed around a corresponding second sub-electrode pattern 132 in a non-closed manner. For example, the plurality of first sub-electrode patterns 131 are connected as a whole, and the plurality of second sub-electrode patterns 132 may or may not be connected. Herein, the numbers of the plurality of first sub-electrode patterns 131 and the plurality of second sub-electrode patterns 132 of the first electrode 13 are not limited, and may be reasonably set according to the shapes of the first sub-electrode pattern 131 and the second sub-electrode pattern 132.

The embodiments of the present disclosure do not limit the shapes of the first sub-electrode pattern 131 and the second sub-electrode pattern 132, as long as the first sub-electrode pattern 131 and the second sub-electrode pattern 132 of the first electrode 13 of the driving backplane 1 (not including the micro light-emitting diode 2, that is, before the micro light-emitting diode 2 is transferred onto the driving backplane 1) are spaced apart to be insulated from each other.

In some embodiments of the present disclosure, as shown in FIGS. 3 to 5, the display panel 100 further includes a plurality of first connecting electrodes 17 electrically connected to the first sub-electrode pattern 131 of the first electrode 13.

For example, after the micro light-emitting diode 2 is transferred onto the driving backplane 1, the first sub-electrode pattern 131 of the first electrode 13 is electrically connected to one of an anode and a cathode of the micro light-emitting diode 2 through a first connecting electrode 17. In this way, the one of the anode and the cathode of the micro light-emitting diode 2 is electrically connected to the pixel driving circuit 12, so that the micro light-emitting diode 2 may be driven to emit light through the pixel driving circuit 12. In addition, the first connecting electrode 17 has a function of fixing the micro light-emitting diode 2 on the driving backplane 1.

In some embodiments, the micro light-emitting diode 2 is a vertical micro light-emitting diode. As shown in FIGS. 3 to 5, the vertical micro light-emitting diode includes an anode 21 and a cathode 22, and a light-emitting functional layer between the anode 21 and the cathode 22 (FIGS. 3 to 5 each illustrate an example in which the lower electrode is the anode 21 and the upper electrode is the cathode 22), and the anode 21 and the cathode 22 are arranged in the thickness direction of the base 11. The embodiments of the present disclosure will be described with reference to FIGS. 3 to 5 by taking the electrode closer to the base 11 (the lower electrode) as the anode 21 and the electrode further away from the base 11 (the upper electrode) as the cathode 22. For example, the anode 21 of the vertical micro light-emitting diode is electrically connected to the first sub-electrode pattern 131 of the first electrode 13 through the first connecting electrode 17, and the cathode 22 of the vertical micro light-emitting diode is electrically connected to a first signal line extending from the display area A to the peripheral region S. The first signal line is configured to supply a constant voltage to the cathode 22 of the vertical micro light-emitting diode. The vertical micro light-emitting diode emits light under control of voltages received by the anode 21 and the cathode 22. For example, the first signal line is the second power line VSS.

In some examples, as shown in FIG. 5, the first connecting electrode 17 is disposed on a surface of the first sub-electrode pattern 131 away from the base 11. After the micro light-emitting diode 2 is transferred onto the driving backplane 1, the first sub-electrode pattern 131 of the first electrode 13 is electrically connected to the anode 21 of the micro light-emitting diode 2 through the first connecting electrode 17.

In this case, for example, the first connecting electrode 17 is made of gold-nickel alloy.

For example, the first connecting electrode 17 is formed by using a gold-nickel alloy film before the micro light-emitting diode 2 is transferred onto the driving backplane 1. A surface of the anode 21 of the micro light-emitting diode 2 is an indium layer and a melting point of the indium (e.g., 156.1° C.) is low. After the micro light-emitting diode 2 is transferred onto the driving backplane 1, melt crystallization is performed on the first connecting electrode 17 made of the gold-nickel material at a high temperature (e.g., 230° C. or more) to form an in-Au eutectic alloy. Therefore, the first sub-electrode pattern 131 and the anode 21 of the micro light-emitting diode 2 may be electrically connected and fixed together.

In some other examples, the first connecting electrode 17 is disposed on at least one side face of the first sub-electrode pattern 131. As shown in FIGS. 3 and 4, after the micro light-emitting diode 2 is transferred onto the driving backplane 1, the first sub-electrode pattern 131 of the first electrode 13 is electrically connected to the anode 21 of the micro light-emitting diode 2 through the first connecting electrode 17.

It will be noted that the side face of the first sub-electrode pattern 131 is one of a plurality of surfaces of the first sub-electrode pattern 131 other than a top surface and a bottom surface that are perpendicular to the thickness direction of the base 11.

For example, as shown in FIG. 4, the first sub-electrode pattern 131 is disposed around the second sub-electrode pattern 132 in the non-closed manner, and the first connecting electrode 17 is disposed on a side face of the first sub-electrode pattern 131 away from the second sub-electrode pattern 132.

In this case, for example, the first connecting electrode 17 is made of solder paste.

In this case, after the micro light-emitting diode 2 is transferred onto the driving backplane 1, solder paste is formed on the side face of the first sub-electrode pattern 131 of the first electrode 13 by screen printing, and then the solder paste is made reflow on the side face of the first sub-electrode pattern 131 away from the second sub-electrode pattern 132 by using a reflow soldering method, so that the first sub-electrode pattern 131 and the anode 21 of the micro light-emitting diode 2 may be electrically connected and fixed together.

For another example, as shown in FIG. 3, the first sub-electrode pattern 131 is disposed around the second sub-electrode pattern 132 in the non-closed manner, and the first connecting electrode 17 is disposed between the first sub-electrode pattern 131 and the second sub-electrode pattern 132.

In this case, for example, the first connecting electrode 17 is made of solder paste.

In this case, after the micro light-emitting diode 2 is transferred onto the driving backplane 1, solder paste is filled between the first sub-electrode pattern 131 and the second sub-electrode pattern 132 of the first electrode 13, and then the solder paste is made reflow between the first sub-electrode pattern 131 and the second sub-electrode pattern 132 by using the reflow soldering method, so that the first sub-electrode pattern 131 of the first electrode 13 and the anode 21 of the micro light-emitting diode 2 may be electrically connected and fixed together.

It will be noted that the filling herein may be printing, but the embodiments of the present disclosure are not limited to printing as long as the solder paste can be filled between the first sub-electrode pattern 131 and the second sub-electrode pattern 132.

In a case where the first sub-electrode pattern 131 of the first electrode 13 is electrically connected to the anode 21 of the micro light-emitting diode 2 through a conductive adhesive, since the conductive adhesive is generally an anisotropic material, and generates conductivity only in a direction of applied pressure, pressure should be applied to the micro light-emitting diode 2 when the first sub-electrode pattern 131 is electrically connected to the anode 21 of the micro light-emitting diode 2 through the conductive adhesive. If too much pressure is applied, there may be a risk of damage to the micro light-emitting diode 2 or the driving backplane 1, and if too little pressure is applied, the conductivity uniformity of the conductive adhesive may not be completely guaranteed. However, in some embodiments of the present disclosure, since no pressure will be applied to the micro light-emitting diode 2 when the first sub-electrode pattern 131 of the first electrode 13 is electrically connected to the anode 21 of the micro light-emitting diode 2 through solder paste or gold-nickel alloy, the problem occurring when the first sub-electrode pattern 131 is electrically connected to the anode 21 of the micro light-emitting diode 2 through the conductive paste may be solved.

In some embodiments, as shown in FIGS. 12 to 17, the driving backplane 1 further includes a plurality of second electrodes 15 and a plurality of second piezoelectric blocks 16. For example, the second electrode 15 includes a third sub-electrode pattern 151 and a fourth sub-electrode pattern 152 that are in a same layer and are spaced apart to be insulated from each other. The third sub-electrode pattern 151 of the second electrode 15 is electrically connected to the first signal line. Each second electrode 15 is disposed in a corresponding sub-pixel region, and the second electrode 15 and the first electrode 13 that are disposed in a same sub-pixel region are disposed in a same layer and are insulated from each other. The plurality of second piezoelectric blocks 16 are disposed in a same layer as the plurality of first piezoelectric blocks 14, and the third sub-electrode pattern 151 and the fourth sub-electrode pattern 152 of the second electrode 15 are in contact with a corresponding second piezoelectric block 16.

In some examples, each of some of the plurality of second electrodes 15 includes the third sub-electrode pattern 151 and the fourth sub-electrode pattern 152 that are in a same layer and are spaced apart to be insulated from each other. In this case, the third sub-electrode pattern 151 is electrically connected to a corresponding first signal line, and both the third sub-electrode pattern 151 and the fourth sub-electrode pattern 152 of the second electrode 15 are in contact with a corresponding second piezoelectric block 16.

In some other examples, each of the plurality of second electrodes 15 includes the third sub-electrode pattern 151 and the fourth sub-electrode pattern 152 that are in a same layer and are spaced apart to be insulated from each other. In this case, the third sub-electrode pattern 151 is electrically connected to a corresponding first signal line, and both the third sub-electrode pattern 151 and the fourth sub-electrode pattern 152 of the second electrode 15 are in contact with a corresponding second piezoelectric block 16.

In some examples, the first signal line is the second power line VSS. Taking a position of the first signal line shown in FIGS. 12 to 17 as an example, the insulating layer 19 of the driving backplane 1 is also located between the first signal line and the plurality of second piezoelectric blocks 16. The insulating layer 19 further has a plurality of second via holes 192. The third sub-electrode pattern 151 of the second electrode 15 may be electrically connected to the corresponding first signal line through a corresponding second via hole 192. It can be understood that the insulating layer 19 may have a single-layer structure such as a silicon nitride film or an organic insulating film, or a multilayer structure, such as a composite structure of a silicon nitride film and a silicon oxide film.

In some examples, a material of the second piezoelectric block 16 is the same as the material of the first piezoelectric block 14. A shape of the second piezoelectric block 16 may be a rectangular shape or other shape, as long as a corresponding relationship between the second piezoelectric block 16 and the second electrode 15 can be ensured.

When the micro light-emitting diode 2 is transferred onto the driving backplane 1, the first piezoelectric block 14 and the second piezoelectric block 16 may generate charges of different signs on respective upper and lower surfaces of the first piezoelectric block 14 and the second piezoelectric block 16 respectively under action of instantaneous pressure applied to the first piezoelectric block 14 and the second piezoelectric block 16. The fourth sub-electrode pattern 152 and the second sub-electrode pattern 132 may carry static electricity due to contact with the first piezoelectric block 14 and the second piezoelectric block 116, respectively. The micro light-emitting diode 2 is adsorbed to the driving backplane 1 under the action of electrostatic adsorption, so that the electrostatic adsorption and transfer of the micro light-emitting diode 2 may be realized.

It will be noted that in the process of transferring the micro light-emitting diode 2 onto the driving backplane 1, since a second gap exists between the third sub-electrode pattern 151 and the fourth sub-electrode pattern 152 of the second electrode 15, it is possible to prevent both the third sub-electrode pattern 151 and the fourth sub-electrode pattern 152 from being electrically connected to the first signal line, so that the charges on the second piezoelectric block 16 may not be conducted away completely. In addition, after the micro light-emitting diode 2 is transferred onto the driving backplane 1, whether the third sub-electrode pattern 151 and the fourth sub-electrode pattern 152 of the second electrode 15 are electrically connected is not limited.

Figure 18:
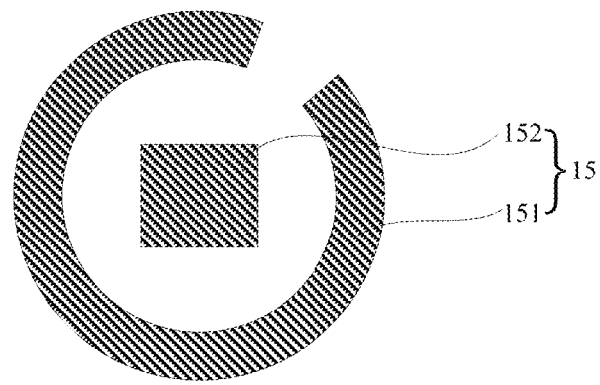
FIG. 18 is a top view of a second electrode, in accordance with some embodiments.
Figure 19:
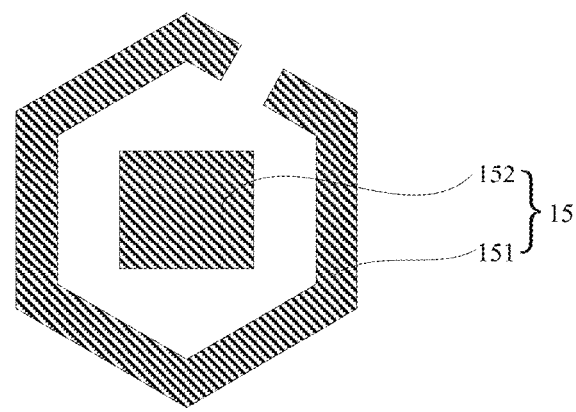
FIG. 19 is a top view of another second electrode, in accordance with some embodiments.
Figure 20:
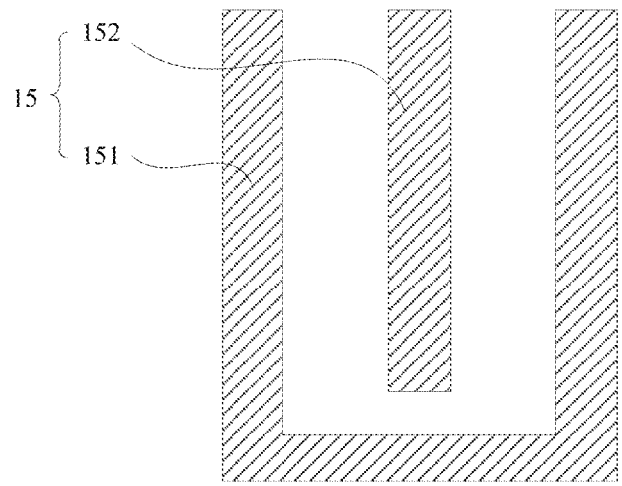
FIG. 20 is a top view of yet another second electrode, in accordance with some embodiments.

In some embodiments, as shown in FIGS. 18 to 20, the third sub-electrode pattern 151 is disposed around the fourth sub-electrode pattern 152 in a non-closed manner.

In some examples, as shown in FIGS. 18 and 19, a shape of the third sub-electrode pattern 151 is a non-closed ring, and the fourth sub-electrode pattern 152 is located within the third sub-electrode pattern 151. The non-closed ring means that the third sub-electrode pattern 151 has an opening. One function of the opening is as follows: after the micro light-emitting diode 2 is transferred onto the driving backplane 1, a conductive material (e.g., the solder paste described below) will be filled between the third sub-electrode pattern 151 and the fourth sub-electrode pattern 152 through the opening of the third sub-electrode pattern 151, so that the third sub-electrode pattern 151 may be electrically connected to the other of anode and cathode of the micro light-emitting diode 2, and thus the other of anode and cathode of the micro light-emitting diode 2 may be electrically connected to the first signal line.

For example, the non-closed ring may be a non-closed circular ring (as shown in Fla 18) or a non-closed elliptical ring. A shape of the fourth sub-electrode pattern 152 is a square, and the fourth sub-electrode pattern 152 is located within the non-closed circular ring or the non-closed elliptical ring.

It will be noted that the other of anode and cathode refers to an electrode not electrically connected to the pixel driving circuit 12. That is, in a case that the anode 21 of the micro light-emitting diode 2 is electrically connected to the pixel driving circuit 12, the cathode 22 of the micro light-emitting diode 2 will be electrically connected to the first signal line; and in a case that the cathode 22 of the micro light-emitting diode 2 is electrically connected to the pixel driving circuit 12, the anode 21 of the micro light-emitting diode 2 will be electrically connected to the first signal line.

For another example, as shown in FIG. 19, the shape of the third sub-electrode pattern 151 is a non-closed polygonal ring, and the fourth sub-electrode pattern 152 is located within the third sub-electrode pattern 151. For example, as shown in FIG. 19, the shape of the third sub-electrode pattern 151 is a non-closed regular hexagonal ring, and the non-closed regular hexagonal ring has an opening passing through a side of the regular hexagonal ring. A shape of the fourth sub-electrode pattern 152 is a square, and the fourth sub-electrode pattern 152 is located within the regular hexagonal ring.

In some other examples, as shown in FIG. 20, the shape of the third sub-electrode pattern 151 is a U shape, and the shape of the fourth sub-electrode pattern 152 is a bar shape. That is, the bar-shaped fourth sub-electrode pattern 152 is located between the two opposite sides of the U-shaped third sub-electrode pattern 151. For example, the bar-shaped fourth sub-electrode pattern 152 is parallel to the two opposite sides of the U-shaped third sub-electrode pattern 151. For example, the shape of the third sub-electrode pattern 151 is a U shape with 90 degrees of corners. For another example, the shape of the third sub-electrode pattern 151 is a U-shape with arc corners.

Figure 21:
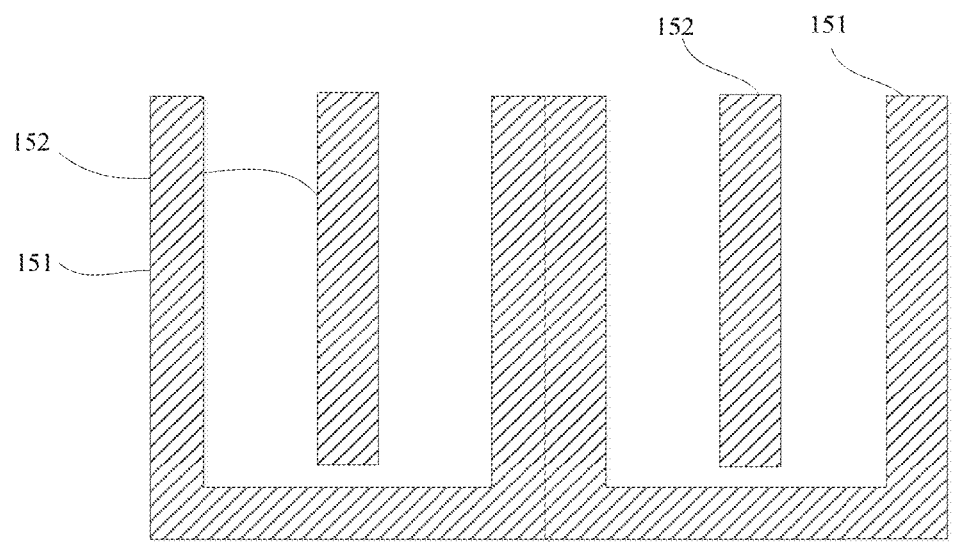
FIG. 21 is a top view of yet another second electrode: in accordance with some embodiments.

In some other embodiments, as shown in FIG. 21, the second electrode 15 includes a plurality of third sub-electrode patterns 151 and a plurality of fourth sub-electrode patterns 152, and each third sub-electrode pattern 151 is disposed around a corresponding fourth sub-electrode pattern 152 in a non-closed manner. For example, the plurality of third sub-electrode patterns 151 are connected as a whole, and the plurality of fourth sub-electrode patterns 152 may or may not be connected. Herein: the numbers of the plurality of third sub-electrode patterns 151 and the plurality of fourth sub-electrode patterns 152 of the second electrode 15 are not limited, and may be reasonably set according to the shapes of the third sub-electrode pattern 151 and the fourth sub-electrode pattern 152.

The embodiments of the present disclosure do not limit the shapes of the third sub-electrode pattern 151 and the fourth sub-electrode pattern 152, as long as the third sub-electrode pattern 151 and the fourth sub-electrode pattern 152 of the second electrode 15 of the driving backplane 1 (not including the micro light-emitting diode 2, that is, before the micro light-emitting diode 2 is transferred onto the driving backplane 1) are spaced apart to be insulated from each other.

In some embodiments of the present disclosure, as shown in FIGS. 12 to 17, the display panel 100 further includes a plurality of second connecting electrodes 18 electrically connecting the third sub-electrode pattern 151 of the second electrode 15 to the other of the anode and the cathode of the micro light-emitting diode 2.

For example, after the micro light-emitting diode 2 is transferred onto the driving backplane 1, the first sub-electrode pattern 131 of the first electrode 13 is electrically connected to one of the anode and the cathode of the micro light-emitting diode 2 through a first connecting electrode 17. The third sub-electrode pattern 151 of the second electrode 15 is electrically connected to the other of the anode and the cathode of the micro light-emitting diode 2 through a second connecting electrode 18.

Figure 12:
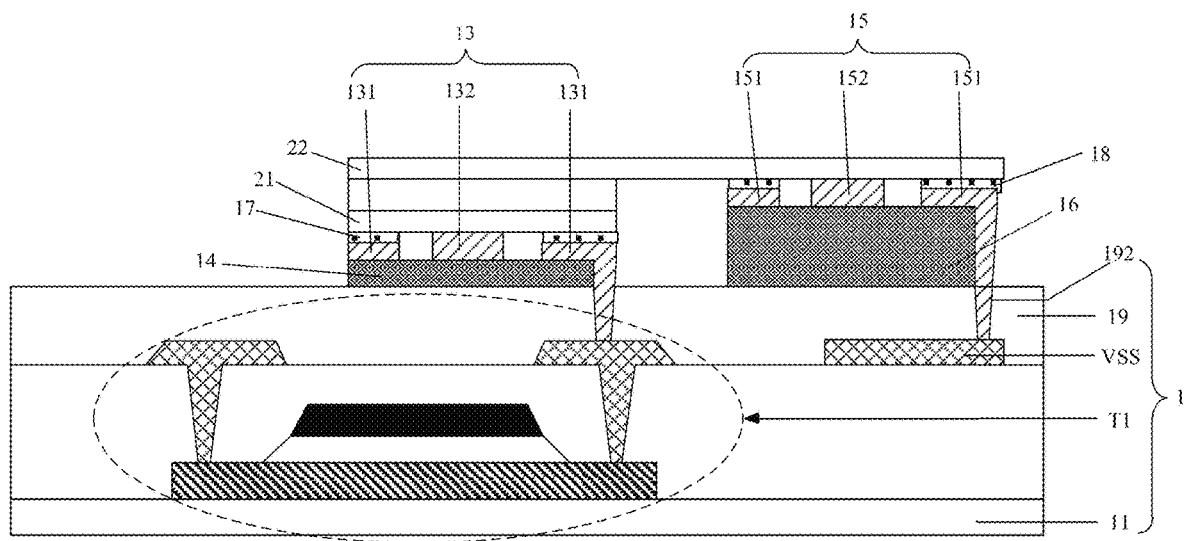
FIG. 12 is yet another cross-sectional view of the display panel along the A-A' line in FIG. 2, in accordance with some embodiments.
Figure 13:
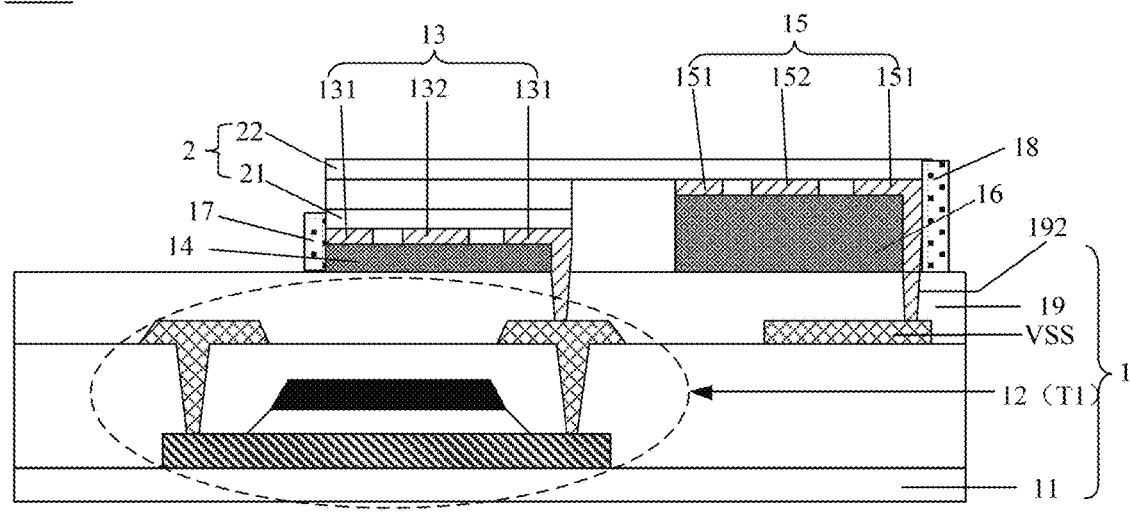
FIG. 13 is yet another cross-sectional view of the display panel along the A-A' line in FIG. 2, in accordance with some embodiments.
Figure 14:
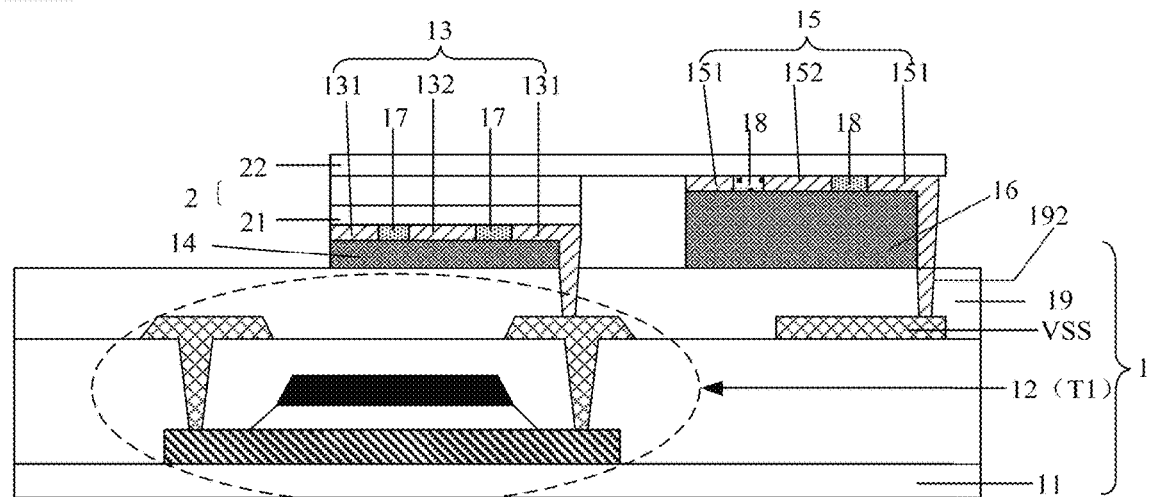
FIG. 14 is yet another cross-sectional view of the display panel along the A-A' line in FIG. 2, in accordance with some embodiments.

In some examples, as shown in FIGS. 12 to 14, the micro light-emitting diode 2 is a vertical micro light-emitting diode. As shown in FIGS. 12 to 14, the vertical micro light-emitting diode 2 includes an anode 21 and a cathode 22, and a light-emitting functional layer between the anode 21 and the cathode 22. The anode 21 of the vertical micro light-emitting diode is electrically connected to the first sub-electrode pattern 131 of the first electrode 13 through the first connecting electrode 17, and the first sub-electrode pattern 131 of the first electrode 13 is directly connected to the pixel driving circuit 12 located in the same sub-pixel region as the first electrode 13. The cathode 22 of the vertical micro light-emitting diode extends above the second electrode 15 and is electrically connected to the third sub-electrode pattern 151 of the second electrode 15 through the second connecting electrode 18. The third sub-electrode pattern 151 of the second electrode 15 is directly connected to the first signal line.

Figure 15:
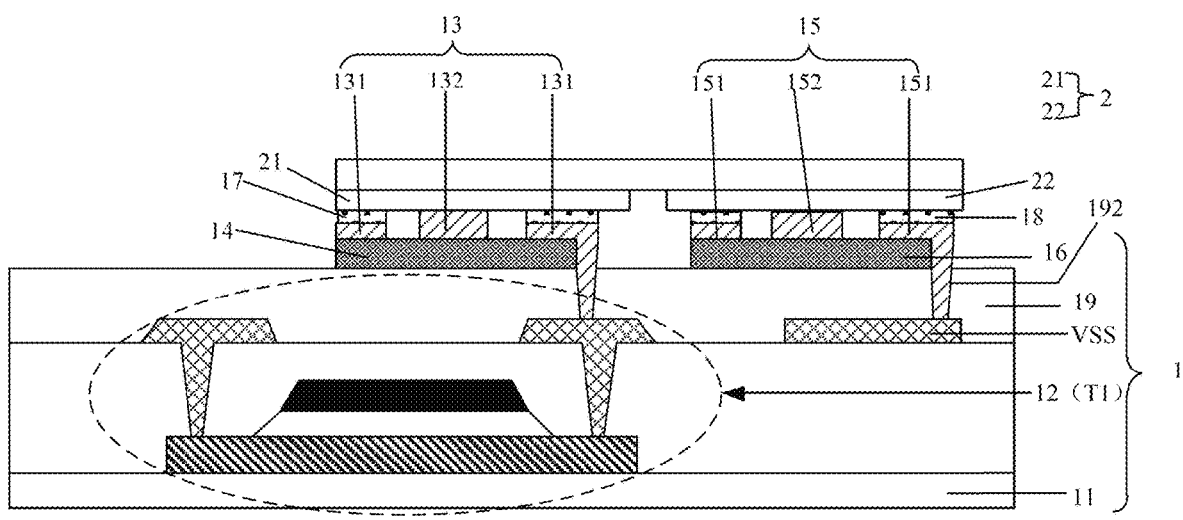
FIG. 15 is yet another cross-sectional view of the display panel along the A-A' line in FIG. 2, in accordance with some embodiments.
Figure 16:
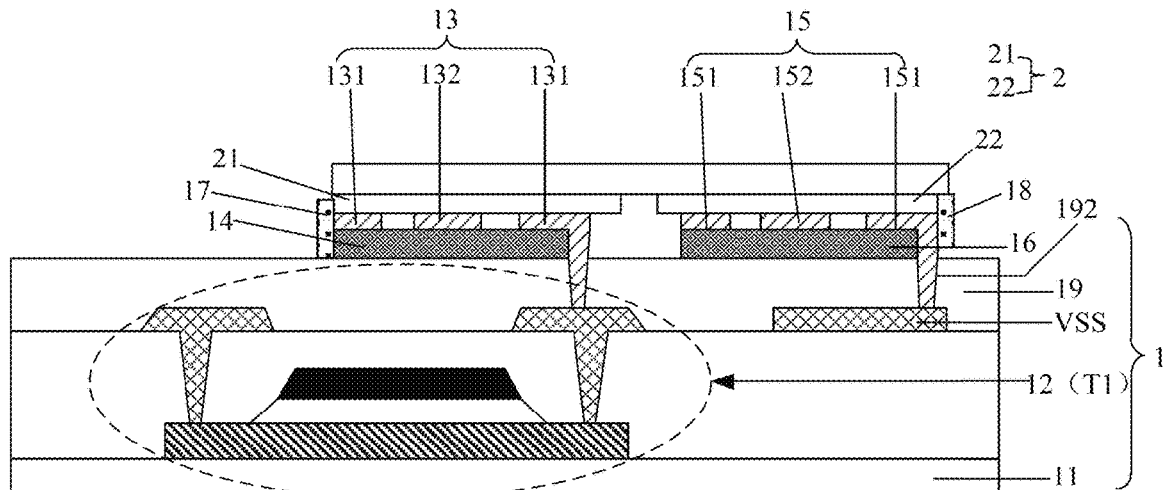
FIG. 16 is yet another cross-sectional view of the display panel along the A-A' line in FIG. 2, in accordance with some embodiments.
Figure 17:
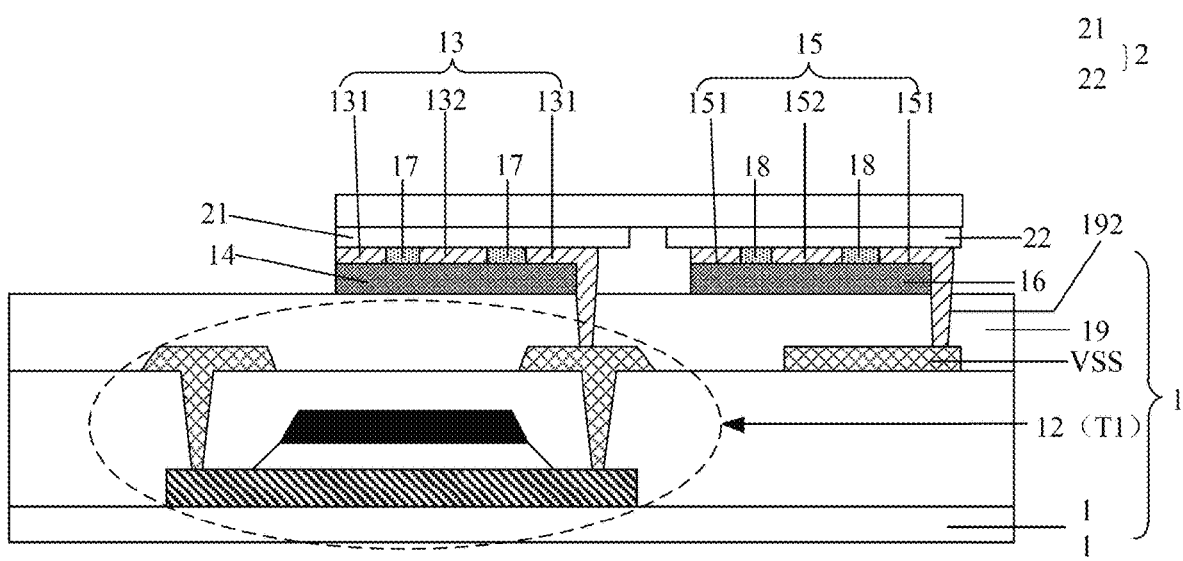
FIG. 17 is yet another cross-sectional view of the display panel along the A-A' line in FIG. 2, in accordance with some embodiments.

In some other examples, as shown in FIGS. 15 to 17, the micro light-emitting diode 2 is a horizontal micro light-emitting diode. As shown in FIGS. 15 to 17, the horizontal micro light-emitting diode 2 includes an anode 21 and a cathode 22, and a light-emitting functional layer that is in contact with and located at a same side of the anode 21 and the cathode 22. The anode 21 and the cathode 22 of the horizontal light-emitting diode are electrically connected to the first electrode 13 and the second electrode 15, respectively. For example, the anode 21 of the horizontal micro light-emitting diode is electrically connected to the first sub-electrode pattern 131 of the first electrode 13 through the first connecting electrode 17. The cathode 22 of the horizontal micro light-emitting diode is electrically connected to the third sub-electrode pattern 151 of the second electrode 15 through the second connecting electrode 18.

In some examples, as shown in FIGS. 12 and 15, the second connecting electrode 18 is disposed on a surface of the third sub-electrode pattern 151 facing away from the base 11. After the micro light-emitting diode 2 is transferred onto the driving backplane 1, the third sub-electrode pattern 151 of the second electrode 15 is electrically connected to the cathode 22 of the micro light-emitting diode 2 through the second connecting electrode 18.

In this case, for example, the second connecting electrode 18 is made of gold-nickel alloy.

For example, the second connecting electrode 18 is formed by using the gold-nickel alloy film before the micro light-emitting diode 2 is transferred onto the driving backplane 1. A surface of the cathode 22 of the micro light-emitting diode is an indium layer and a melting point of the indium is low (156.1° C.). After the micro light-emitting diode 2 is transferred onto the driving backplane 1, melt crystallization is performed on the second connecting electrode 18 made of the gold-nickel material on the third sub-electrode pattern 151 at a high temperature (e.g., 230° C. or more) to form an In—Au eutectic alloy. Therefore, the third sub-electrode pattern 151 and the cathode 22 of the micro light-emitting diode may be electrically connecting and fixed together.

In some other examples, the second connecting electrode 18 is disposed on at least one side face of the third sub-electrode pattern 151. As shown in FIGS. 13 to 14 and 16 to 17, after the micro light-emitting diode 2 is transferred onto the driving backplane 1, the third sub-electrode pattern 151 of the second electrode 15 is electrically connected to the cathode 22 of the micro light-emitting diode 2 through the second connecting electrode 18.

It will be noted that the side face of the third sub-electrode pattern 151 is one of a plurality of surfaces of the third sub-electrode pattern 151 other than a top surface and a bottom surface that are perpendicular to the thickness direction of the base 11.

For example, as shown in FIGS. 13 and 16, the third sub-electrode pattern 151 is disposed around the fourth sub-electrode pattern 152 in a non-closed manner, and the second connecting electrode 18 is disposed on a side face of the third sub-electrode pattern 151 away from the fourth sub-electrode pattern 152.

In this case, for example, the second connecting electrode 18 is made of solder paste.

In this case, after the micro light-emitting diode 2 is transferred onto the driving backplane 1, solder paste is formed on the side face of the third sub-electrode pattern 151 of the second electrode 15 away from the fourth sub-electrode pattern 152 by screen printing, and then the solder paste is made reflow on the side face of the third sub-electrode pattern 151 away from the fourth sub-electrode pattern 152 by using a reflow soldering method, so that the third sub-electrode pattern 151 and the cathode 22 of the micro light-emitting diode 2 may be electrically connected and fixed together.

For another example, as shown in FIGS. 14 and 17, the third sub-electrode pattern 151 is disposed around the fourth sub-electrode pattern 152 in a non-closed manner, and the second connecting electrode 18 is disposed between the third sub-electrode pattern 151 and the fourth sub-electrode pattern 152.

In this case, for example, the second connecting electrode 18 is made of solder paste.

In this case, after the micro light-emitting diode 2 is transferred onto the driving backplane 1, solder paste may be filled between the third sub-electrode pattern 151 and the fourth sub-electrode pattern 152 of the first electrode 15, and then the solder paste is made reflow between the third sub-electrode pattern 151 and the fourth sub-electrode pattern 152 by using the reflow soldering method, so that the third sub-electrode pattern 151 of the second electrode 15 and the cathode 22 of the micro light-emitting diode 2 may be electrically connected and fixed together.

It will be noted that the filling herein may be printing, but the embodiments of the present disclosure are not limited to printing as long as the solder paste can be filled between the third sub-electrode pattern 151 and the fourth sub-electrode pattern 152.

Figure 22:
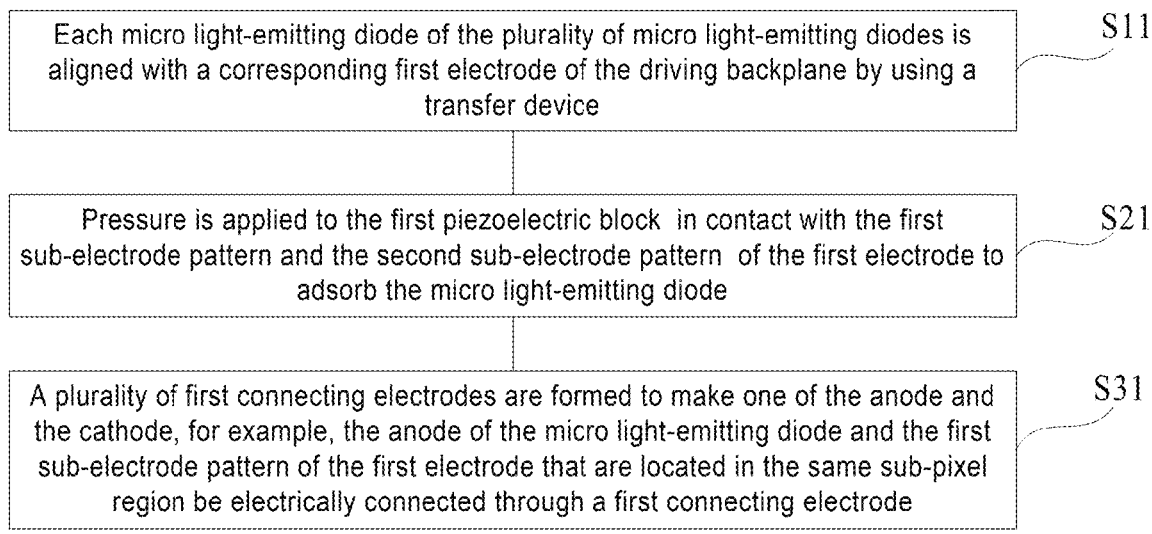
FIG. 22 is a flow chart of a method for manufacturing a display panel, in accordance with some embodiments.

Some embodiments of the present disclosure provide a method for manufacturing a display panel. As shown in FIG. 22, the method includes S11 to S31.

In S11, each micro light-emitting diode 2 of the plurality of micro light-emitting diodes 2 is aligned with a corresponding first electrode 13 of the driving backplane 1 by using a transfer device.

For example, the anode 21 of each micro light-emitting diode 2 of the plurality of micro light-emitting diodes 2 is aligned with a corresponding first electrode 13 of the driving backplane 1 by using the transfer device.

It will be noted that when the micro light-emitting diode 2 is aligned with the corresponding first electrode 13 by using the transfer device, there are various ways to attach the micro light-emitting diode 2 to the transfer device, such as substrate lift-off, electrostatic transfer, or roller transfer (i.e., roller to plate). For example, the micro light-emitting diode is attached to a transfer head of the transfer device through an electrostatic force. Herein, there is no limitation on the manner of attaching the micro light-emitting diode to the transfer device.

In S21, pressure is applied to the first piezoelectric block 14 in contact with the first sub-electrode pattern 131 and the second sub-electrode pattern 132 of the first electrode 13 to adsorb the micro light-emitting diode 2.

For example, during applying pressure to the first piezoelectric block 14, the pressure can be applied to the first piezoelectric block 14 by using the transfer head of the transfer device. The first piezoelectric block 14 generates a piezoelectric effect under action of the pressure, so that charges of different signs appear on upper and lower surfaces of the first piezoelectric block, and thus the second sub-electrode pattern 132 in contact with the first piezoelectric block 14 carries static electricity, thereby adsorbing the micro light-emitting diode to the driving backplane 1. Herein, since the transfer head and the micro light-emitting diode 2 are in physical contact, after adsorption of the micro light-emitting diode 2 is completed, charges on the transfer head may be conducted away by grounding the transfer head, so that the transfer head may release the micro light-emitting diode 2.

In S31, a plurality of first connecting electrodes 17 are formed to make one of the anode and the cathode, for example, the anode of the micro light-emitting diode 2 and the first sub-electrode pattern 131 of the first electrode 13 that are located in the same sub-pixel region be electrically connected through a first connecting electrode 17.

In some examples, as shown in FIG. 5, the first connecting electrode 17 made of the gold-nickel material is electroplated on the first sub-electrode pattern 131 of the first electrode 31 in advance before S11 and S21 are performed, After the micro light-emitting diode 2 is transferred onto the driving backplane 1, i.e., after S21, the first connecting electrode 17 on the first sub-electrode pattern 131 is in contact with the anode 21 of the micro light-emitting diode 2. The surface of the anode 21 of the micro light-emitting diode 2 is an indium layer and the melting point of indium is low (156.1° C.). Therefore, after the micro light-emitting diode 2 is transferred onto the driving backplane 1, melt crystallization is performed on the first connecting electrode 17 made of the gold-nickel material on the first sub-electrode pattern 131 at a high temperature (e.g., 230° C. or more) to form an In—Au eutectic alloy, so that the first sub-electrode pattern 131 and the anode 21 of the micro light-emitting diode 2 may be electrically connected and fixed together.

In some other examples, as shown in FIG. 4, after the micro light-emitting diode 2 is transferred onto the driving backplane 1, solder paste may be formed on the side face of the first sub-electrode pattern 131 of the first electrode 13 away from the second sub-electrode pattern 132 by screen printing, and then the solder paste may be made reflow on the side face of the first sub-electrode pattern 131 away from the second sub-electrode pattern 132 by using the reflow soldering method, so that the first sub-electrode pattern 131 and the anode 21 of the micro light-emitting diode 2 may be electrically connected and fixed together.

In yet other example as shown in FIG. 3, after the micro light-emitting diode 2 is transferred onto the driving backplane 1, solder paste may be filled between the first sub-electrode pattern 131 and the second sub-electrode pattern 132 of the first electrode 13, and then the solder paste may be made reflow between the first sub-electrode pattern 131 and the second sub-electrode pattern 132 by using the reflow soldering method, so that the first sub-electrode pattern 131 and the anode 21 of the micro light-emitting diode 2 may be electrically connected and fixed together.

In some embodiments, as shown in FIGS. 12 to 17, the driving backplane 1 further includes a plurality of second electrodes 15 and a plurality of second piezoelectric blocks 16. The second electrode 15 includes the third sub-electrode pattern 151 and the fourth sub-electrode pattern 152 that are in a same layer and spaced apart to be insulated from each other. The third sub-electrode pattern 151 of the second electrode 15 is electrically connected to the first signal line. Each second electrode 15 is disposed in a corresponding sub-pixel region, and the second electrode 15 and the first electrode 13 that are disposed in a same sub-pixel region are disposed in a same layer and are insulated from each other. The plurality of second piezoelectric blocks 16 are disposed in a same layer as the plurality of first piezoelectric blocks 14, and the third sub-electrode pattern 151 and the fourth sub-electrode pattern 152 of the second electrode 15 are in contact with a corresponding second piezoelectric block 16.

Based on the above structure, in acme embodiments, the method further includes S12 to S32.

In S12, each micro light-emitting diode 2 of the plurality of micro light-emitting diodes 2 is aligned with a corresponding second electrode 15 of the driving backplane 1 by using the transfer device.

Herein, S12 is performed simultaneously when S11 is performed, That is, when the anode 21 of each micro light-emitting diode 2 is aligned with a corresponding first electrode 13 of the driving backplane 1 by using the transfer device, the cathode 22 of the micro light-emitting diode 2 is aligned with a corresponding second electrode 15.

In addition, like S11, in S12, there are various ways to attach the micro light-emitting diode 2 to the transfer device, such as substrate lift-off, electrostatic transfer, roller transfer (i.e., roller to plate). For example, the micro light-emitting diode 2 is attached to the transfer head of the transfer device through an electrostatic force. Herein, there is no limitation on a manner of attaching the micro light-emitting diode 2 to the transfer device.

In S22, pressure is applied to the second piezoelectric block in contact with the third sub-electrode pattern 151 and the fourth sub-electrode pattern 152 of the second electrode 15 simultaneously when pressure is applied to the first piezoelectric block 14 in contact with the first sub-electrode pattern 131 and the second sub-electrode pattern 132 of the first electrode 13, to adsorb the micro light-emitting diode 2.

It will be noted that, in the embodiments, S22 is performed simultaneously when S21 is performed. That is, pressure is applied to the second piezoelectric block 16 in contact with the third sub-electrode pattern 151 and the fourth sub-electrode pattern 152 of the second electrode 15 simultaneously when pressure is applied to the first piezoelectric block 14 in contact with the first sub-electrode pattern 131 and the second sub-electrode pattern 132 of the first electrode 13, so as to adsorb the micro light-emitting diode 2 by utilizing the piezoelectric effect of the first piezoelectric block 14 and the second piezoelectric block 16.

It will be noted that a manner in which pressure is applied to the second piezoelectric block 16 is the same as the manner in S21, which will not be described herein again.

In S32, a plurality of second connecting electrodes 18 are formed to make the other of the anode and the cathode, for example, the cathode of the micro light-emitting diode 2 and the third sub-electrode pattern 151 of the second electrode 15 that are located in the same sub-pixel region be electrically connected through a second connecting electrode 18.

S32 is performed simultaneously when S31 is performed. That is, the plurality of second connecting electrodes 18 are formed simultaneously when the plurality of first connecting electrodes 17 are formed.

In some examples, after the micro light-emitting diode 2 is transferred onto the driving backplane 1, solder paste is formed on the side face of the third sub-electrode pattern 151 of the second electrode 15 away from the fourth sub-electrode pattern 152 by screen printing, and then the solder paste is made reflow on the side face of the third sub-electrode pattern 151 away from the fourth sub-electrode pattern 152 by using the reflow soldering method, so that the third sub-electrode pattern 151 and the cathode 22 of the micro light-emitting diode 2 may be electrically connected and fixed together.

In some other examples, after the micro light-emitting diode 2 is transferred onto the driving backplane 1, solder paste may be filled between the third sub-electrode pattern 151 and the fourth sub-electrode pattern 152, and then the solder paste may be made reflow between the third sub-electrode pattern 151 and the fourth sub-electrode pattern 152 by using the reflow soldering method, so that the third sub-electrode pattern 151 and the cathode 22 of the micro light-emitting diode 2 may be electrically connected and fixed together.

In yet other examples, before the micro light-emitting diode 2 is transferred onto the driving backplane 1, that is, before S12 and S22 are performed, the second connecting electrode 18 made of the gold-nickel material is electroplated on the third sub-electrode pattern 151 of the second electrode 15. After the micro light-emitting diode 2 is transferred onto the driving backplane 1, i.e., after S22, the second connecting electrode 18 on the third sub-electrode pattern 151 is in contact with the cathode 22 of the micro light-emitting diode. The surface of the cathode 22 of the micro light-emitting diode 2 is an indium layer and the melting point of indium is low (156.1° C.). After the micro light-emitting diode 2 is transferred onto the driving backplane 1, melt crystallization is performed on the second connecting electrode 18 made of the gold-nickel material on the third sub-electrode pattern 151 at a high temperature (e.g., 230° C. or more) to form an In—Au eutectic alloy, thereby electrically connecting the third sub-electrode pattern 151 and the anode 21 of the micro light-emitting diode 2 together.

It will be understood that the connection between the anode 21 of the micro light-emitting diode 2 and the first sub-electrode pattern 131 of the first electrode 13, and the connection between the cathode 22 of the micro light-emitting diode 2 and the third sub-electrode pattern 151 of the second electrode 15 may be determined according to actual structure of the display panel.

The forgoing descriptions are merely specific implementation manners of the present disclosure, but the protection scope of the present disclosure is not limited thereto. Any person skilled in the art could conceive of changes or replacements within the technical scope of the present disclosure, which shall all be included in the protection scope of the present disclosure. Therefore, the protection scope of the present disclosure shall be subject to the protection scope of the claims.

What is claimed is:

1. A driving backplane, having a sub-pixel region, the driving backplane comprising:
   a base;
   a pixel driving circuit disposed in the sub-pixel region on the base;
   a first electrode disposed in the sub-pixel region and disposed at a side of the pixel driving circuit away from the base; the first electrode including a first sub-electrode pattern and a second sub-electrode pattern that are in a same layer and are spaced apart to be insulated from each other; the first sub-electrode pattern being electrically connected to the pixel driving circuit; and
   a first piezoelectric block disposed in the sub-pixel region and between the pixel driving circuit and the first electrode, the first sub-electrode pattern and the second sub-electrode pattern being in contact with the first piezoelectric block.

2. The driving backplane according to claim 1, wherein the first sub-electrode pattern is disposed around the second sub-electrode pattern in a non-closed manner.

3. The driving backplane according to claim 2, wherein a shape of the first sub-electrode pattern is a non-closed ring, and the second sub-electrode pattern is disposed within the first sub-electrode pattern.

4. The driving backplane according to claim 2, wherein a shape of the first sub-electrode pattern is a U-shape, a shape of the second sub-electrode pattern is a bar-shape, and the second sub-electrode pattern is disposed between two opposite sides of the first sub-electrode pattern.

5. The driving backplane according to claim 1, further comprising:
   a second electrode disposed in the sub-pixel region, the second electrode including a third sub-electrode pattern and a fourth sub-electrode pattern that are in a same layer and are spaced apart to be insulated from each other; the third sub-electrode pattern being electrically connected to a first signal line, and the second electrode and the first electrode being disposed in a same layer and insulated from each other; and
   a second piezoelectric block disposed in the sub-pixel region, the second piezoelectric block being disposed in a same layer as the first piezoelectric block, and the third sub-electrode pattern and the fourth sub-electrode pattern being in contact with the second piezoelectric block.

6. The driving backplane according to claim 5, wherein the third sub-electrode pattern is disposed around the fourth sub-electrode pattern in a non-closed manner.

7. The driving backplane according to claim 6, wherein a shape of the third sub-electrode pattern is a non-closed ring, and the fourth sub-electrode pattern is disposed within the third sub-electrode pattern.

8. The driving backplane according to claim 6, wherein a shape of the third sub-electrode pattern is a U shape, a shape of the fourth sub-electrode pattern is a bar shape, and the fourth sub-electrode pattern is disposed between two opposite sides of the third sub-electrode pattern.

9. A display panel, comprising:
   the driving backplane according to claim 1;
   a micro light-emitting diode disposed on a side of the first electrode of the driving backplane away from the base, the micro light-emitting diode being disposed in the sub-pixel region; and
   a first connecting electrode electrically connecting one of an anode and a cathode of the micro light-emitting diode to the first sub-electrode pattern of the first electrode.

10. The display panel according to claim 9, wherein the first connecting electrode is disposed on a surface of the first sub-electrode pattern away from the base.

11. The display panel according to claim 10, wherein the first connecting electrode is made of gold-nickel alloy.

12. The display panel according to claim 9, wherein the first connecting electrode is disposed on at least one side face of the first sub-electrode pattern.

13. The display panel according to claim 12, wherein the first sub-electrode pattern is disposed around the second sub-electrode pattern in a non-closed manner; and
   the first connecting electrode is disposed on a side face of the first sub-electrode pattern away from the second sub-electrode pattern, or the first connecting electrode is disposed between the first sub-electrode pattern and the second sub-electrode pattern.

14. The display panel according to claim 13, wherein the first connecting electrode is made of solder paste.

15. The display panel according to claim 9, wherein the driving backplane further includes:
   a second electrode disposed in the sub-pixel region; the second electrode including a third sub-electrode pattern and a fourth sub-electrode pattern that are in a same layer and are spaced apart to be insulated from each other; the third sub-electrode pattern being electrically connected to a first signal line; and the second electrode and the first electrode being disposed in a same layer and insulated from each other; and
   a second piezoelectric block disposed in the sub-pixel region; the second piezoelectric block being disposed in a same layer as the first piezoelectric block, and the third sub-electrode pattern and the fourth sub-electrode pattern being in contact with the second piezoelectric block;
   the display panel further includes a second connecting electrode disposed in the sub-pixel region; another of the anode and the cathode of the micro light-emitting diode and the third sub-electrode pattern are electrically connected through the second connecting electrode.

16. The display panel according to claim 15, wherein the micro light-emitting diode further includes a light-emitting functional layer that is in contact with and located at a same side of the anode and the cathode away from the first connecting electrode.

17. The display panel according to claim 16, wherein the second connecting electrode is disposed on a surface of the third sub-electrode pattern away from the base.

18. The display panel according to claim 16, wherein the third sub-electrode pattern is disposed around the fourth sub-electrode pattern in a non-closed manner; and the second connecting electrode is disposed on at least one side face of the third sub-electrode pattern away from the fourth sub-electrode pattern, or; the second connecting electrode is disposed between the third sub-electrode pattern and the fourth sub-electrode pattern.

19. A method for manufacturing the display panel according to claim 9, comprising:

aligning the micro light-emitting diode with the first electrode of the driving backplane;

applying pressure to the first piezoelectric block in contact with the first sub-electrode pattern and the second sub-electrode pattern, to adsorb the micro light-emitting diode; and forming the first connecting electrode, to make the one of the anode and the cathode of the micro light-emitting diode and the first sub-electrode pattern of the first electrode be electrically connected through the first connecting electrode.

20. The method according to claim 19, wherein the driving backplane further includes a second electrode and a second piezoelectric block that are disposed in the sub-pixel region; the second electrode includes a third sub-electrode pattern and a fourth sub-electrode pattern that are in a same layer and are spaced apart to be insulated from each other; the third sub-electrode pattern of the second electrode is electrically connected to a first signal line; and the second electrode and the first electrode disposed in a same sub-pixel region are disposed in a same layer and insulated from each other; the second piezoelectric block is disposed in a same layer as the first piezoelectric block, and the third sub-electrode pattern and the fourth sub-electrode pattern of the second electrode are in contact with the second piezoelectric block; and the method further includes:

aligning the micro light-emitting diode with the second electrode of the driving backplane while aligning the micro light-emitting diode with the first electrode of the driving backplane;

applying pressure to the second piezoelectric block in contact with the third sub-electrode pattern and the fourth sub-electrode pattern of the second electrode while applying pressure to the first piezoelectric block in contact with the first sub-electrode pattern and the second sub-electrode pattern of the first electrode, to adsorb the micro light-emitting diode; and forming the second connecting electrode while forming the first connecting electrode, to make another of the anode and the cathode of the micro light-emitting diode and the third sub-electrode pattern of the second electrode be electrically connected through the second connecting electrode.

\* \* \* \* \*